(12) United States Patent
Yamazaki et al.

(10) Patent No.: US 11,869,417 B2
(45) Date of Patent: Jan. 9, 2024

(54) DISPLAY DEVICE

(71) Applicant: Semiconductor Energy Laboratory Co., Ltd., Atsugi (JP)

(72) Inventors: Shunpei Yamazaki, Setagaya (JP); Kei Takahashi, Isehara (JP); Susumu Kawashima, Atsugi (JP); Koji Kusunoki, Isehara (JP); Kazunori Watanabe, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 29 days.

(21) Appl. No.: 17/975,920

(22) Filed: Oct. 28, 2022

(65) Prior Publication Data

US 2023/0046927 A1 Feb. 16, 2023

Related U.S. Application Data

(63) Continuation of application No. 17/271,221, filed as application No. PCT/IB2019/057395 on Sep. 3, 2019, now Pat. No. 11,501,695.

(30) Foreign Application Priority Data

Sep. 12, 2018 (JP) .................................. 2018-170461

(51) Int. Cl.
G09G 3/32 (2016.01)
(52) U.S. Cl.
CPC ......... *G09G 3/32* (2013.01); *G09G 2330/028* (2013.01)

(58) Field of Classification Search
CPC .. G09G 3/32; G09G 2330/028; G09G 3/3659; G09G 3/3696; G09G 2300/0819;
(Continued)

(56) References Cited

U.S. PATENT DOCUMENTS 8,462,145 B2  6/2013  Kim et al.
8,884,852 B2  11/2014  Yamamoto et al.
(Continued)

FOREIGN PATENT DOCUMENTS

CN    101887689 A    11/2010
CN    106560884 A     4/2017
(Continued)

OTHER PUBLICATIONS

International Search Report (Application No. PCT/IB2019/057395) dated Dec. 10, 2019.
(Continued)

*Primary Examiner* — Andrew Sasinowski
(74) *Attorney, Agent, or Firm* — ROBINSON INTELLECTUAL PROPERTY LAW OFFICE; Eric J. Robinson

(57) ABSTRACT

The power consumption of a display device is reduced. The power consumption of a driver circuit in a display device is reduced. A pixel included in the display device includes a display element. The pixel is configured to have a function of retaining a first voltage corresponding to a first input pulse signal and a function of driving the display element with a third voltage obtained by addition of a second voltage corresponding to a second input pulse signal to the first voltage.

8 Claims, 15 Drawing Sheets

(58) Field of Classification Search
CPC ..... G09G 2300/0852; G09G 2330/021; G09G 2330/02; G02F 1/133; H01L 27/32; H01L 33/00; H01L 51/50
See application file for complete search history.

(56) References Cited

U.S. PATENT DOCUMENTS

| | | | |
|---|---|---|---|
| 10,061,172 B2* | 8/2018 | Yamazaki | ........... H01L 27/1225 |
| 2010/0289830 A1 | 11/2010 | Yamamoto et al. | |
| 2013/0193874 A1 | 8/2013 | Takahashi et al. | |
| 2013/0261835 A1 | 10/2013 | Takahashi et al. | |
| 2014/0347555 A1 | 11/2014 | Hirakata et al. | |
| 2015/0003034 A1 | 1/2015 | Nakamura et al. | |
| 2015/0028837 A1 | 1/2015 | Takahashi | |
| 2015/0055118 A1 | 2/2015 | Yamazaki et al. | |
| 2016/0117584 A1 | 4/2016 | Yoneda et al. | |
| 2017/0040344 A1 | 2/2017 | Fujita | |
| 2017/0098414 A1 | 4/2017 | Yang et al. | |
| 2017/0179160 A1 | 6/2017 | Takahashi | |
| 2017/0187360 A1* | 6/2017 | Uesugi | ................ G09G 3/3648 |
| 2017/0256207 A1* | 9/2017 | Takahashi | ............ G09G 3/3233 |
| 2018/0033359 A1 | 2/2018 | Yoneda et al. | |
| 2018/0210561 A1* | 7/2018 | Shigemori | ............. G09B 21/00 |
| 2019/0378859 A1 | 12/2019 | Kawashima et al. | |
| 2020/0013332 A1 | 1/2020 | Kimura et al. | |
| 2020/0175905 A1 | 6/2020 | Yamazaki et al. | |
| 2020/0258921 A1 | 8/2020 | Takahashi et al. | |
| 2020/0302889 A1 | 9/2020 | Takahashi et al. | |
| 2021/0005155 A1 | 1/2021 | Toyotaka et al. | |
| 2021/0090513 A1 | 3/2021 | Takahashi et al. | |

FOREIGN PATENT DOCUMENTS

| | | |
|---|---|---|
| JP | 2010-156963 A | 7/2010 |
| JP | 2010-266494 A | 11/2010 |
| KR | 2010-0122443 A | 11/2010 |
| KR | 2017-0040737 A | 4/2017 |
| TW | 201106323 | 2/2011 |
| TW | 201714157 | 4/2017 |

OTHER PUBLICATIONS

Written Opinion (Application No. PCT/IB2019/057395) dated Dec. 10, 2019.

\* cited by examiner

FIG. 12A1
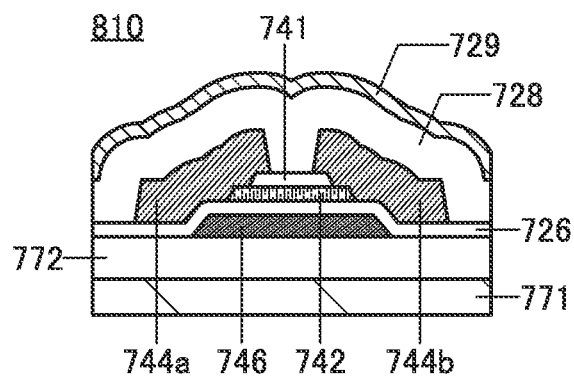
FIG. 12A2
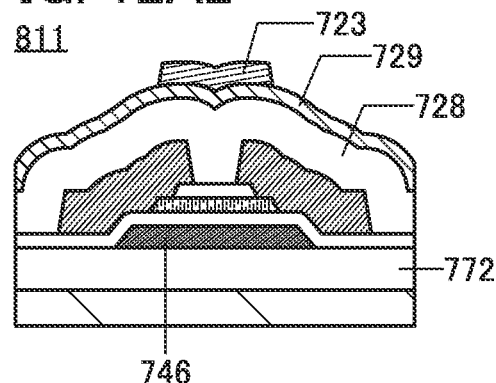
FIG. 12B1
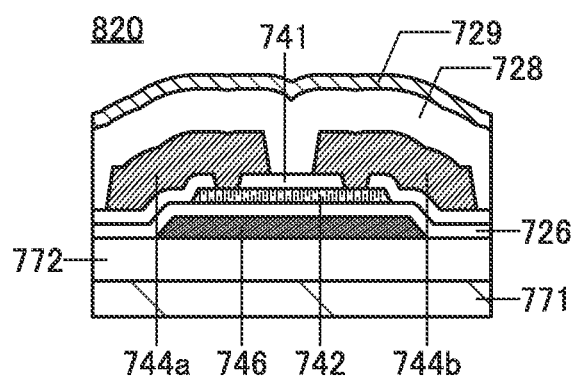
FIG. 12B2
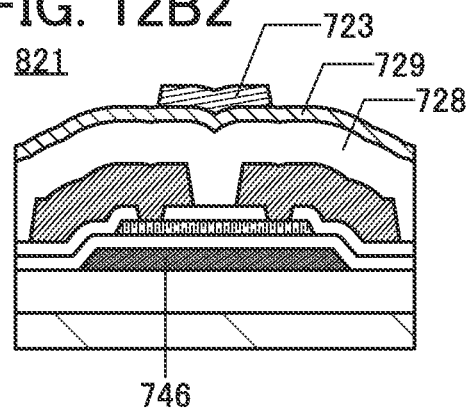
FIG. 12C1
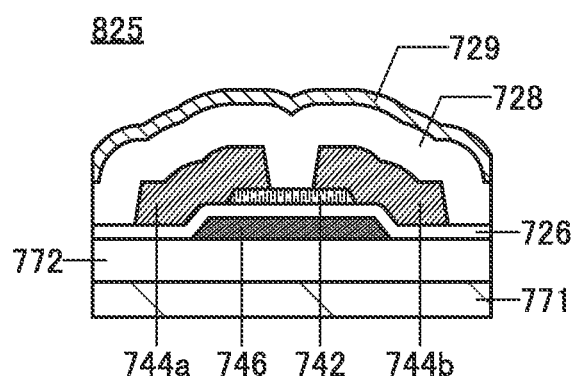
FIG. 12C2
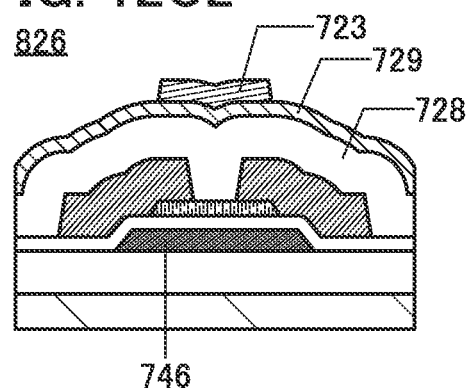

FIG. 13A1
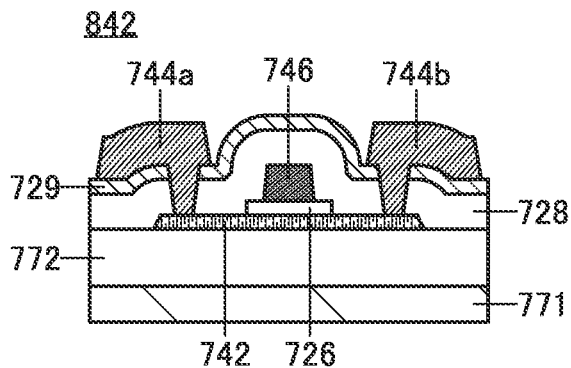
FIG. 13A2
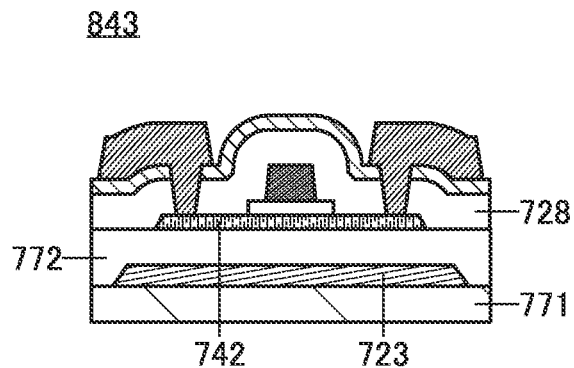
FIG. 13A3
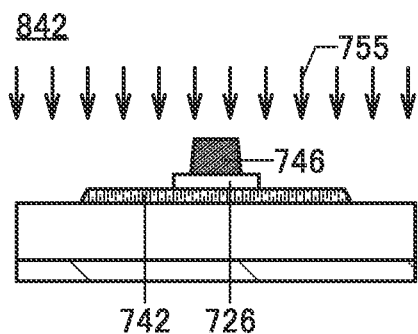
FIG. 13B1
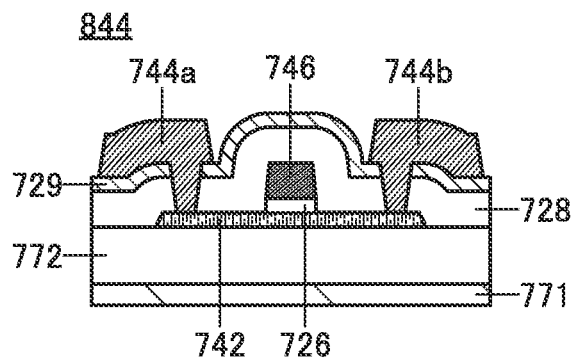
FIG. 13B2
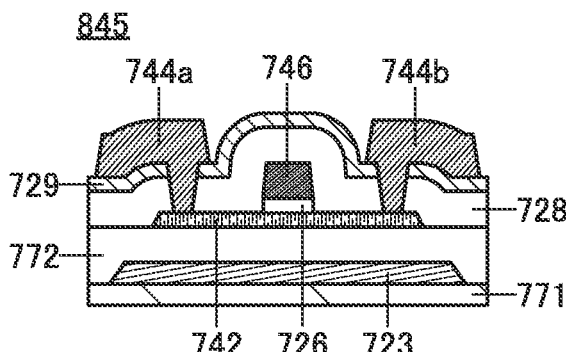
FIG. 13C1
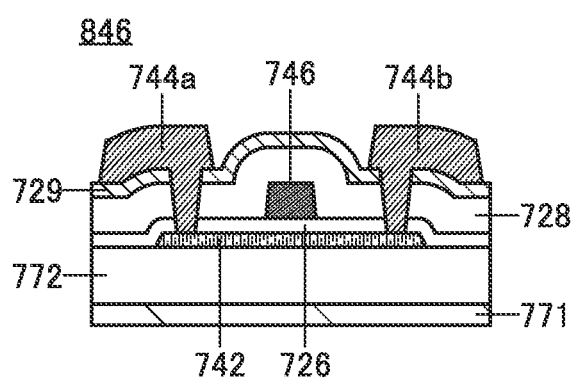
FIG. 13C2
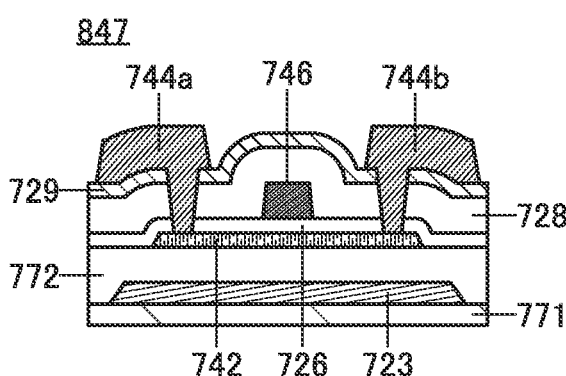

DISPLAY DEVICE

TECHNICAL FIELD

One embodiment of the present invention relates to a semiconductor device, a display device, and an operation method thereof.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

In recent years, display devices included in cellular phones such as smartphones, tablet information terminals, laptop PCs (personal computers), portable game consoles, and the like have undergone various improvements. For example, display devices have been developed aiming for higher resolution, higher color reproducibility, a smaller driver circuit, lower power consumption, and the like.

For example, a technique for employing a transistor whose channel formation region contains a metal oxide as a switching element included in a pixel circuit of a display device can be given. In particular, an In—Ga—Zn-based oxide can be used as the metal oxide. Patent Document 1 discloses an invention where a transistor whose channel formation region contains an In—Ga—Zn-based oxide is used in a pixel circuit of a display device.

In addition, for example, Patent Document 2 discloses an invention of a source driver IC that uses a multi-tone linear digital-analog converter circuit to display a multi-tone image on a display device including a light-emitting element.

PRIOR ART DOCUMENTS

Patent Documents

[Patent Document 1] Japanese Published Patent Application No. 2010-156963
[Patent Document 2] U.S. Pat. No. 8,462,145

SUMMARY OF THE INVENTION

Problems to be Solved by the Invention

To display a high-quality image, a display device needs to have, for example, a high resolution, multi tones, and a wide color gamut. For example, in a display device including a liquid crystal element or a light-emitting element such as an organic EL (Electro Luminescence) element, a source driver circuit needs to be suitably designed to achieve a multi-tone image.

However, it is necessary to increase the resolution of a digital-analog converter circuit included in the source driver circuit for handling multi-tone image data. In contrast, in the case where a digital-analog converter circuit with high resolution is designed, the circuit area is increased.

In addition, a circuit portion that handles analog signals, such as a digital-analog converter circuit included in a source driver circuit, needs a higher power supply voltage than a circuit portion that generates digital signals. Thus, it has been difficult to reduce the power consumption of the source driver circuit. Furthermore, a device on which a display panel is mounted needs a circuit that generates at least two kinds of power supply voltages.

An object of one embodiment of the present invention is to reduce the power consumption of a display device. Another object is to reduce the power consumption of a driver circuit in a display device. Another object is to provide a display device including a source driver circuit that can be driven with a single power supply voltage. Another object is to reduce the power consumption of a device including a display device. Another object is to simplify the structure of a display device, a driver circuit, or a device including a display device.

Another object is to provide a pixel circuit capable of generating multi-tone image data (the pixel circuit is also referred to as a semiconductor device in this specification and the like). Another object is to provide a display device including the semiconductor device. Another object is to provide an electronic device including the display device.

Another object is to provide a display device including a source driver circuit with a small circuit area. Another object is to provide a display device including a source driver circuit having low power consumption.

Note that the description of these objects does not disturb the existence of other objects. Note that one embodiment of the present invention does not need to achieve all the objects. Note that objects other than these can be derived from the description of the specification, the drawings, the claims, and the like.

Means for Solving the Problems

One embodiment of the present invention is a display device including a pixel. The pixel includes a display element. The pixel has a function of retaining a first voltage corresponding to a first input pulse signal and a function of driving the display element with a third voltage obtained by addition of a second voltage corresponding to a second input pulse signal to the first voltage.

In addition, in the above, it is preferable that the display element be a light-emitting element. In that case, the light-emitting element preferably emits light at luminance corresponding to the third voltage. Furthermore, it is preferable to use an organic EL element or a light-emitting diode as the light-emitting element. Moreover, it is preferable to use a micro LED or a mini LED as the light-emitting diode.

Alternatively, in the above, it is preferable that the display element be a liquid crystal element. In that case, in the liquid crystal element, liquid crystal alignment preferably changes in accordance with the third voltage.

In addition, in the above, a first driver circuit supplying the first pulse signal is preferably included. In that case, in the first driver circuit, a first power supply voltage for generating the first pulse signal is preferably lower than the maximum value of the third voltage. Furthermore, the first driver circuit preferably generates the first pulse signal without boosting the first power supply voltage. Moreover, the first power supply voltage is preferably a half of the maximum value of the third voltage or a voltage in the vicinity thereof.

In addition, in the above, a system circuit controlling the first driver circuit is preferably included. In that case, the system circuit preferably has a function of supplying the first power supply voltage to the first driver circuit.

In addition, in the above, one of drive voltages of the system circuit is 1.8 V, 2.5 V, 3.3 V, or a voltage in the vicinity thereof. The system circuit preferably has a function of supplying the same voltage as the drive voltage to the first driver circuit as the first power supply voltage.

In addition, in the above, the first power supply voltage supplied from the system circuit to the first driver circuit is preferably supplied without being boosted.

Effect of the Invention

According to one embodiment of the present invention, the power consumption of a display device can be reduced. Alternatively, the power consumption of a driver circuit in a display device can be reduced. Alternatively, a display device including a source driver circuit that can be driven with a single power supply voltage can be provided. Alternatively, the power consumption of a device including a display device can be reduced. Alternatively, the structure of a display device, a driver circuit, or a device including a display device can be simplified.

Furthermore, according to one embodiment of the present invention, a semiconductor device capable of generating multi-tone image data can be provided. Alternatively, a display device including a source driver circuit with a small circuit area can be provided. Alternatively, a display device including a source driver circuit having low power consumption can be provided.

Note that the description of the effects does not disturb the existence of other effects. Note that one embodiment of the present invention does not need to have all the effects. Note that effects other than these can be derived from the description of the specification, the drawings, the claims, and the like.

BRIEF DESCRIPTION OF THE DRAWINGS

FIG. 12A1 to FIG. 12C2 are cross-sectional views each illustrating a transistor structure example.

FIG. 13A1 to FIG. 13C2 are cross-sectional views each illustrating a transistor structure example.

MODE FOR CARRYING OUT THE INVENTION

Figure 1:
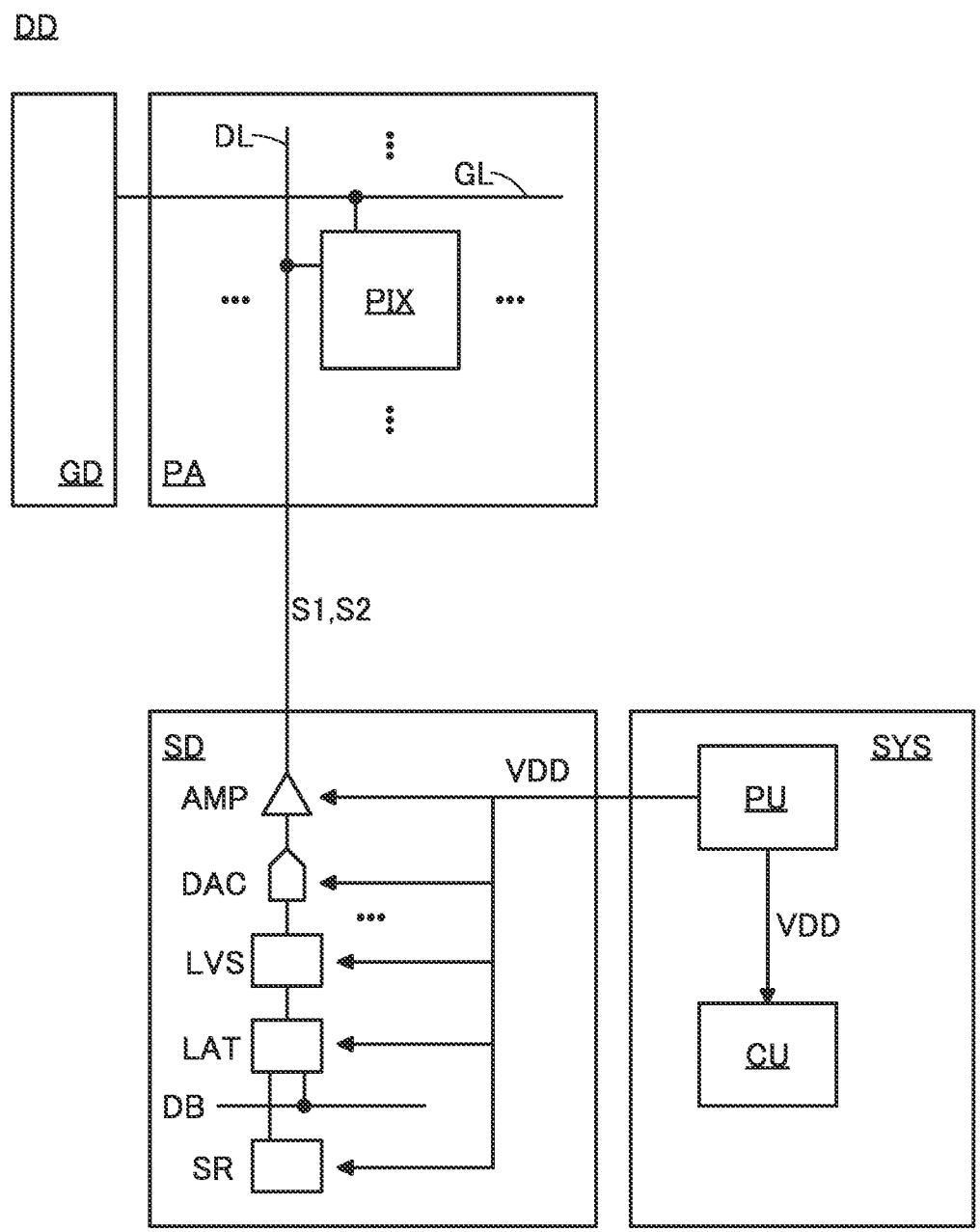
FIG. 1 is a block diagram illustrating a display device example.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the present invention described below, the same reference numerals are used in common for the same portions or portions having similar functions in different drawings, and a repeated description thereof is omitted. Moreover, similar functions are denoted by the same hatch pattern and are not denoted by specific reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that ordinal numbers such as "first" and "second" in this specification are used in order to avoid confusion among components and do not limit the components numerically.

In this specification and the like, a display panel that is one embodiment of a display device has a function of displaying (outputting) an image or the like on (to) a display surface. Therefore, the display panel is one embodiment of an output device.

Furthermore, in this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, a semiconductor device of one embodiment of the present invention and a display device including the semiconductor device will be described.

<Display Device Circuit Configuration>

FIG. 1 is a block diagram illustrating an example of a display device DD. The display device DD includes a display portion PA, a source driver circuit SD, and a gate driver circuit GD.

The display portion PA includes a plurality of pixels PIX. In FIG. 1, only one of the plurality of pixels PIX in the display portion PA is illustrated and the other pixels PIX are omitted. The plurality of pixels PIX in the display portion PA are preferably arranged in a matrix.

The pixel PIX is electrically connected to the source driver circuit SD through a wiring DL. The pixel PIX is electrically connected to the gate driver circuit GD through a wiring GL. Since the display portion PA includes the plurality of pixels PIX, the plurality of pixels PIX may be electrically connected to the wiring DL and the wiring GL. In addition, a plurality of wirings DL and a plurality of wirings GL may be provided in accordance with the number of the pixels PIX included in the display portion PA. Furthermore, depending on the circuit configuration of the pixel PIX, a plurality of wirings DL or a plurality of wirings GL may be electrically connected to one pixel PIX.

The pixel PIX can have a structure that includes one or more subpixels. For example, a structure with one subpixel (any one color of red (R), green (G), blue (B), white (W), or the like), a structure with three subpixels (three colors of red (R), green (G), and blue (B), or the like), or a structure with four or more subpixels (for example, four colors of red (R), green (G), blue (B), and white (W), four colors of red (R), green (G), blue (B), and yellow (Y), or the like) can be applied to the pixel PIX. Note that color elements employed for the subpixels are not limited to the above, and may be combined with cyan (C), magenta (M), or the like as necessary.

The pixel PIX includes at least one or more display elements. A variety of display elements such as a light-emitting element, a liquid crystal element, a microcapsule, an electrophoretic element, an electrowetting element, an electrofluidic element, an electrochromic element, and a MEMS element can be used as the display element.

As the light-emitting element, an organic EL element, an LED (Light Emitting Diode) element, an inorganic EL element, or the like can be used.

Examples of the LED element include a macro LED (also referred to as a huge LED), a mini LED, a micro LED, and the like in descending order in size. Here, an LED chip whose one side dimension is greater than 1 mm is referred to as a macro LED, an LED chip whose one side dimension is greater than 100 μm and less than or equal to 1 mm is referred to as a mini LED, and an LED chip whose one side dimension is less than or equal to 100 μm is referred to as a micro LED. It is particularly preferable to use a mini LED or a micro LED as an LED element applied to the pixel PIX. The use of a micro LED can achieve an extremely high-resolution display device.

The source driver circuit SD has a function of generating image data to be input to the pixel PIX included in the display portion PA and a function of transmitting the image data to the pixel PIX.

The source driver circuit SD can include, for example, a shift register SR, a latch circuit LAT, a level shift circuit LVS, a digital-analog converter circuit DAC, an amplifier circuit AMP, and a data bus wiring DB. In FIG. 1, an output terminal of the shift register SR is electrically connected to a clock input terminal of the latch circuit LAT; an input terminal of the latch circuit LAT is electrically connected to the data bus wiring DB; an output terminal of the latch circuit LAT is electrically connected to an input terminal of the level shift circuit LVS; an output terminal of the level shift circuit LVS is electrically connected to an input terminal of the digital-analog converter circuit DAC; an output terminal of the digital-analog converter circuit DAC is electrically connected to an input terminal of the amplifier circuit AMP; and an output terminal of the amplifier circuit AMP is electrically connected to the display portion PA.

Note that the latch circuit LAT, the level shifter circuit LVS, the digital-analog converter circuit DAC, and the amplifier circuit AMP that are illustrated in FIG. 1 are provided for one wiring DL. That is, the numbers of the latch circuits LAT, the level shifter circuits LVS, the digital-analog converter circuits DAC, and the amplifier circuits AMP each need to be more than one, depending on the number of the wirings DL. Note that in this case, the shift register SR may have a structure in which pulse signals are sequentially transmitted to a clock input terminal of each of the plurality of latch circuits LAT.

The data bus wiring DB is a wiring for transmitting a digital signal containing image data to be input to the display portion PA. The image data has gray levels; as the number of gray levels increases, changes in color or brightness can be expressed with a smooth gradation and a natural image can be displayed on the display portion PA. Note that an increase in the number of gray levels increases the volume of the image data and requires a digital-analog converter circuit with high resolution.

A digital signal containing image data is input to the input terminal of the latch circuit LAT from the data bus wiring DB. Then, the latch circuit LAT performs either one of retention operation of the image data and output operation of the retained image data from the output terminal in response to a signal transmitted from the shift register SR.

The level shift circuit LVS has a function of converting an input signal into an output signal with a higher amplitude voltage or a lower amplitude voltage. In FIG. 1, the level shift circuit LVS has a function of converting the amplitude voltage of a digital signal containing image data that is transmitted from the latch circuit LAT into an amplitude voltage at which the digital-analog converter circuit DAC operates properly.

The digital-analog converter circuit DAC has a function of converting an input digital signal containing image data into an analog signal and a function of outputting the analog signal from the output terminal. In particular, in the case where multi-tone image data is displayed on the display portion PA, the digital-analog converter circuit DAC needs to be a high-resolving-power digital-analog converter circuit.

The amplifier circuit AMP has a function of amplifying an analog signal (for example, amplifying a voltage or a current) input to the input terminal and outputting the signal to the output terminal. By providing the amplifier circuit AMP between the digital-analog converter circuit DAC and the display portion PA, image data can be stably transmitted to the display portion PA. A voltage follower circuit or the like including an operational amplifier and the like can be applied to the amplifier circuit AMP. Note that in the case where a circuit including a differential input circuit is used as the amplifier circuit, the offset voltage of the differential input circuit is preferably a voltage that is as close to 0 V as possible.

Through the above operations, the source driver circuit SD can convert the digital signal containing image data that is transmitted from the data bus wiring DB into an analog signal and transmit the analog signal to the display portion PA. The source driver circuit SD has a function of generating a first signal S1 and a second signal S2 that are analog signals and supplying the first signal S1 and the second signal S2 to the pixel PIX through the wiring DL. Here, the first signal S1 and the second signal S2 are pulse signals each having an amplitude corresponding to image data.

The gate driver circuit GD has a function of selecting, from the plurality of pixels PIX included in the display portion PA, a pixel PIX to which image data is input.

As a method for inputting image data to the display portion PA, for example, the gate driver circuit GD may transmit a selection signal to the plurality of pixels PIX electrically connected to one wiring GL, bringing image-data-write switching elements of the plurality of pixels PIX into on states, and then transmit image data from the source driver circuit SD to the plurality of pixels PIX through the wiring DL so that the image data is written.

Note that one embodiment of the present invention is not limited to the structure of the display device DD illustrated in FIG. 1. One embodiment of the present invention can have a component of the display device DD changed as appropriate according to circumstances such as design specifications and the purpose, for example.

Meanwhile, in the case where a multi-tone image is displayed on the display portion PA, the digital-analog converter circuit DAC has high resolution. In that case, the size of the digital-analog converter circuit DAC increases; thus, the circuit area of the source driver circuit SD increases in some cases. When circuit elements in a circuit included in the source driver circuit SD, such as a transistor and a capacitor, are shrunk to reduce the circuit area of the source driver circuit SD, the electrical characteristics of the circuit elements might degrade through the influence of parasitic resistance, the influence of a structure variation caused in manufacture of the circuit elements, or the like.

In view of the above, one embodiment of the present invention is constructed such that the potential of an image data retention portion of the pixel PIX is changed to a potential with higher resolution than that of the digital-analog converter circuit DAC through capacitive coupling. Thus, the digital-analog converter circuit with low resolution can be used because the increase in the resolution of the digital-analog converter circuit becomes unnecessary. Consequently, the circuit area of the source driver circuit SD including the digital-analog converter circuit DAC can be reduced, and the power consumption of the source driver circuit SD can be reduced.

FIG. 1 illustrates an example in which the display device DD includes a system circuit SYS. The system circuit SYS has a function of controlling the operation of the source driver circuit SD. For example, the system circuit SYS has a function of supplying a variety of signals such as a data signal, a clock signal, and a start pulse signal and a power supply voltage to the source driver circuit SD.

Here, an example in which a power supply generation unit PU and a control unit CU are included as the system circuit SYS is illustrated.

The control unit CU includes at least a logic circuit. For example, the control unit CU can have a structure that includes a processor such as a CPU (Central Processing Unit) or a GPU (Graphics Processing Unit).

The power supply generation unit PU has a function of generating a power supply voltage VDD to be supplied to the control unit CU and the source driver circuit SD. For example, the power supply generation unit PU can convert power supplied from a battery, a power supply plug, or the like to generate the power supply voltage VDD.

As described later, the pixel PIX included in the display device DD can generate a voltage obtained by addition of the amplitude of two signals (the first signal S1 and the second signal S2) to drive the display element. Thus, when display is performed on the pixel PIX at the highest gray level, the voltage of each of the first signal S1 and the second signal S2 that are supplied from the source driver circuit SD can be a half of the sum of the voltages of these signals or a voltage in the vicinity thereof.

Thus, the source driver circuit SD does not need a high power supply voltage for generating an analog signal and can operate with the single power supply voltage VDD. In FIG. 1, the power supply voltage VDD supplied from the system circuit SYS to the source driver circuit SD and the power supply voltage VDD for driving the control unit CU can be common.

The power supply voltage VDD supplied from the system circuit SYS is supplied to the shift register SR, the latch circuit LAT, the level shift circuit LVS, the digital-analog converter circuit DAC, and the amplifier circuit AMP in the source driver circuit SD. Note that in that case, it is also possible to omit the level shift circuit LVS.

Such a configuration eliminates the need for a booster circuit for boosting a power supply voltage, such as a DCDC converter, between the system circuit SYS and the source driver circuit SD. That is, the power supply voltage VDD supplied from the system circuit SYS to the source driver circuit SD is directly supplied to the source driver circuit SD without being boosted and is used to generate the first signal S1 and the second signal S2.

In addition, it is not necessary to provide a booster circuit for boosting the power supply voltage VDD in the source driver circuit SD; thus, the circuit configuration of the source driver circuit SD can be simplified and the power consumption of the source driver circuit SD can be reduced. In other words, the source driver circuit SD can generate the first signal S1 and the second signal S2 without boosting the power supply voltage VDD.

For example, when one of the drive voltages of respective circuits including the control unit CU in the system circuit SYS is 1.8 V, 2.5 V, 3.3 V, or a voltage in the vicinity thereof, the voltage can be supplied to the source driver circuit SD as the power supply voltage VDD. Accordingly, the power supply generation unit PU in the system circuit SYS does not need to generate a high power supply voltage to be supplied to the source driver circuit SD, and the circuit configuration of the power supply generation unit PU can be simplified.

With such a configuration, the source driver circuit SD can be driven at a low voltage; thus, the power consumption of the source driver circuit SD and the display device DD can be drastically reduced.

Note that in this specification and the like, in the case where a voltage is referred to as a voltage in the vicinity of a certain voltage, the voltage includes the range of ±20% of the voltage.

<Pixel Circuit Configuration>

A circuit configuration example of the pixel PIX that is a semiconductor device of one embodiment of the present invention will be described.

The pixel PIX illustrated below has a function of retaining a first voltage corresponding to a first pulse signal (the first signal S1) input from the source driver circuit SD and a function of driving a display element with a third voltage obtained by addition of a second voltage corresponding to a second pulse signal (the second signal S2) to the first voltage. That is, in the pixel PIX, the display element can be driven with a voltage higher than the maximum voltage of each of the first pulse signal and the second pulse signal input from the source driver circuit SD.

For example, in the case where a light-emitting element is used as the display element, an image can be displayed when the light-emitting element emits light at luminance corresponding to the third voltage. In addition, in the case where a liquid crystal element is used as the display element, the transmittance of light from a light source such as a backlight is changed due to a change in liquid crystal alignment in accordance with the third voltage so that an image can be displayed.

In addition, the power supply voltage VDD that is used by the source driver circuit SD illustrated in FIG. 1 to generate the first signal S1 and the second signal S2 can be a voltage lower than the maximum value of the third voltage that can be generated in the pixel PIX (for example, the value of the third voltage when display is performed at the highest gray level). The power supply voltage VDD can be suitably a half (½) of the maximum value of the third voltage or a voltage in the vicinity thereof.

Figure 2A:
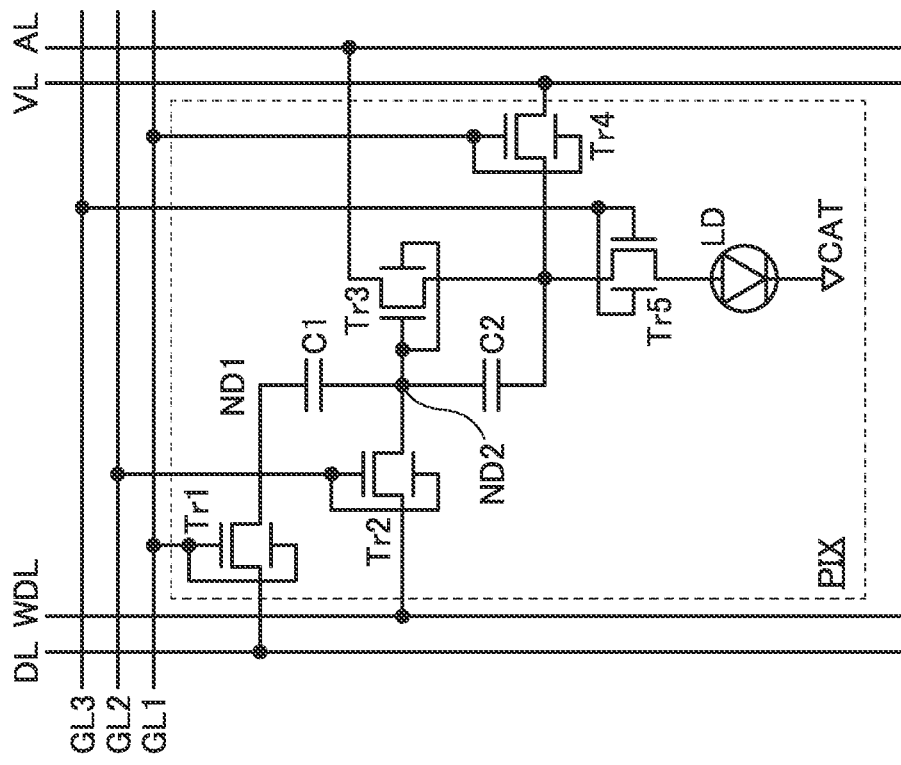
FIG. 2A and FIG. 2B are circuit diagrams each illustrating a pixel example.

The pixel PIX illustrated in FIG. 2A is an example in which a light-emitting element is applied to the display element.

The pixel PIX illustrated in FIG. 2A includes a transistor Tr1 to a transistor Tr5, a capacitor C1, a capacitor C2, and a light-emitting element LD. In addition, the wiring DL, a wiring WDL, a wiring GL1 to a wiring GL3, a wiring VL, a wiring AL, and a wiring CAT are electrically connected to the pixel PIX.

The transistor Tr1, the transistor Tr2, the transistor Tr4, and the transistor Tr5 each function as a switching element. The transistor Tr3 functions as a driving transistor that controls a current flowing to the light-emitting element LD. In addition, structures described in Embodiment 3 can be applied to the transistor Tr1 to the transistor Tr5.

Each of the wiring DL and the wiring WDL is a wiring for transmitting image data to the pixel PIX and corresponds to the wiring DL of the display device DD in FIG. 1. In addition, each of the wiring GL1 to the wiring GL3 is a selection signal line for the pixel PIX and is a wiring corresponding to the wiring GL of the display device DD in FIG. 1.

The wiring VL is a wiring for applying a predetermined potential to a specific node in the pixel PIX. The wiring AL is a wiring for supplying a current flowing to the light-emitting element LD.

The wiring CAT is a wiring for applying a predetermined potential to a cathode terminal of the light-emitting element LD. The predetermined potential can be, for example, a reference potential, a low-level potential, a potential lower than these potentials, or the like.

A first terminal of the transistor Tr1 is electrically connected to a first terminal of the capacitor C1; a second terminal of the transistor Tr1 is electrically connected to the wiring DL; and a gate of the transistor Tr1 is electrically connected to the wiring GL1. A first terminal of the transistor Tr2 is electrically connected to a gate of the transistor Tr3, a second terminal of the capacitor C1, and a first terminal of the capacitor C2; a second terminal of the transistor Tr2 is electrically connected to the wiring WDL; and a gate of the transistor Tr2 is electrically connected to the wiring GL2.

Note that in this embodiment, an electrical connection point of the first terminal of the transistor Tr1 and the first terminal of the capacitor C1 is referred to as a node ND1, and an electrical connection point of the first terminal of the transistor Tr2, the gate of the transistor Tr3, the second terminal of the capacitor C1, and the first terminal of the capacitor C2 is referred to as a node ND2.

Here, a voltage (potential) written to the node ND2 from the wiring WDL through the transistor Tr2 corresponds to the first voltage (potential). In addition, a voltage written to the node ND1 from the wiring DL through the transistor Tr1 corresponds to the second voltage. Furthermore, when the second voltage is written to the node ND1, the second voltage is added to the first voltage by capacitive coupling through the capacitor C1, and the voltage of the node ND2 is changed. The resulting voltage of the node ND2 corresponds to the third voltage.

A first terminal of the transistor Tr3 is electrically connected to the wiring AL, and a second terminal of the transistor Tr3 is electrically connected to a first terminal of the transistor Tr4, a first terminal of the transistor Tr5, and a second terminal of the capacitor C2. A second terminal of the transistor Tr4 is electrically connected to the wiring VL, and a gate of the transistor Tr4 is electrically connected to the wiring GL1. A second terminal of the transistor Tr5 is electrically connected to an anode terminal of the light-emitting element LD, and a gate of the transistor Tr5 is electrically connected to the wiring GL3. The cathode terminal of the light-emitting element LD is electrically connected to the wiring CAT.

In the pixel PIX in FIG. 2A, each of the transistor Tr1, the transistor Tr2, and the transistor Tr5 is preferably an OS transistor. In particular, an OS transistor is preferably an oxide containing at least one of indium, an element M (the element M is aluminum, gallium, yttrium, or tin), and zinc in a channel formation region. In addition, the oxide will be described in detail in Embodiment 4. The application of such OS transistors to the transistor Tr1, the transistor Tr2, and the transistor Tr5 enables the off-state currents of the transistors to be extremely low. In the case where data is retained in the first terminal of the capacitor C1 (the node ND1), when the transistor Tr1 is an OS transistor, data retained in the node ND1 can be prevented from being corrupted by the off-state current. Similarly, when data is retained in the gate of the transistor Tr3, the second terminal of the capacitor C1, and the first terminal of the capacitor C2 (the node ND2), the use of an OS transistor as the transistor Tr2 can prevent data retained in the node ND2 from being corrupted by the off-state current. Furthermore, in the case where light emission of the light-emitting element LD is temporarily stopped, the use of an OS transistor as the transistor Tr5 can prevent light emission of the light-emitting element LD due to the off-state current.

A transistor including silicon in a channel formation region (hereinafter referred to as a Si transistor) can be applied to each of the transistor Tr3 and the transistor Tr4. For example, hydrogenated amorphous silicon, microcrystalline silicon, polycrystalline silicon, or the like can be used as silicon.

In addition, an OS transistor can be applied to each of the transistor Tr3 and the transistor Tr4. In particular, when all of the transistor Tr1 to the transistor Tr5 are OS transistors, the transistors can be formed at the same time, allowing shortening of manufacturing steps of the display portion PA in some cases. Thus, the time needed to produce the display portion PA can be shortened, and the number of the display portions PA that are produced in a certain period can be increased.

Operation Example

Next, an operation example of the pixel PIX illustrated in FIG. 2A is described. Note that the wiring DL and the wiring WDL of the pixel PIX in FIG. 2A are assumed to be electrically connected to the source driver circuit SD in FIG. 1 so that image data can be transmitted to the pixel PIX.

Figure 4:
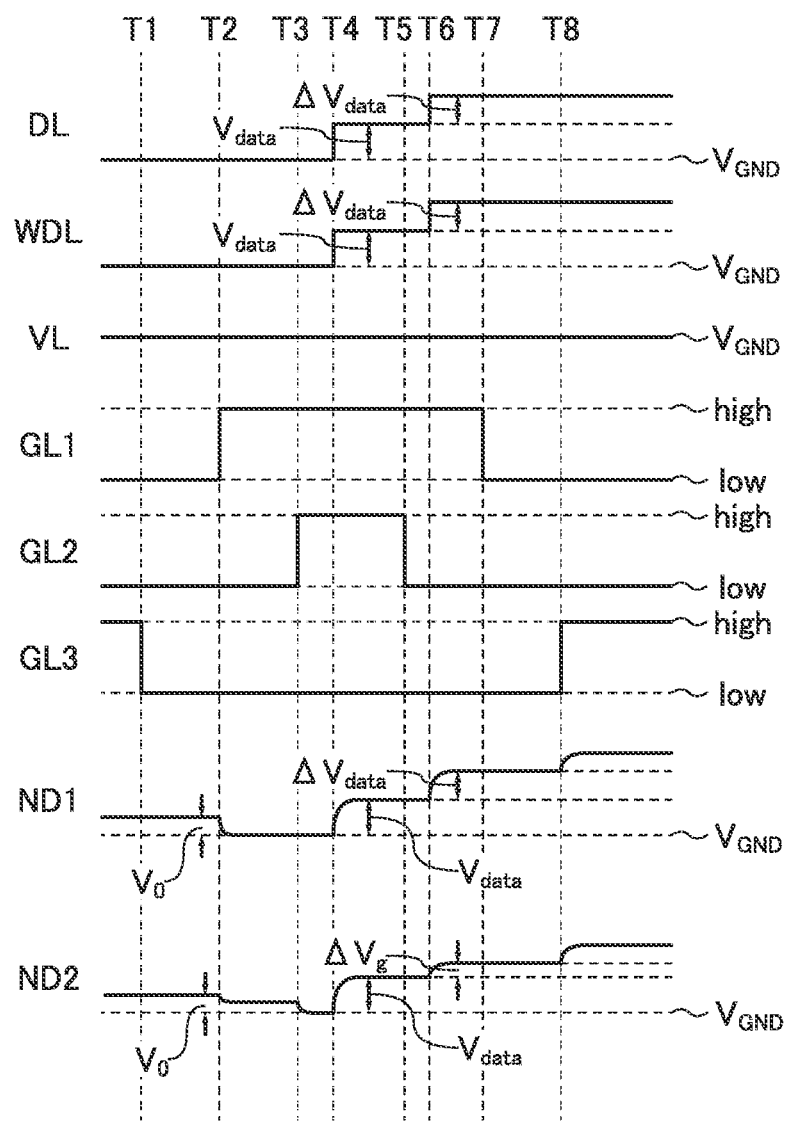
FIG. 4 is a timing chart for illustrating a pixel operation example.

FIG. 4 is a timing chart showing an operation example of the pixel PIX illustrated in FIG. 2A. The timing chart shown in FIG. 4 shows changes in the potentials of the wiring DL, the wiring WDL, the wiring VL, the wiring GL1 to the wiring GL3, the node NDT, and the node ND2 in a period from Time T1 to Time T8 and at time close to the period. Note that "high" described in FIG. 4 indicates a high-level potential, and "low" indicates a low-level potential. In addition, $V_{GND}$ described in FIG. 4 indicates a reference potential.

Note that $V_{GND}$ is assumed to be constantly applied to the wiring VL during the period from Time T1 to Time T8 and at the time close to the period.

Note that in this operation example, the transistor Tr1, the transistor Tr2, the transistor Tr4, and the transistor Tr5 are assumed to operate in a linear region unless otherwise specified. In other words, the gate voltage, source voltage, and drain voltage of each of the transistor Tr1, the transistor Tr2, the transistor Tr4, and the transistor Tr5 are assumed to be appropriately biased to voltages in the range where the transistor operates in the linear region.

Furthermore, in this operation example, the transistor Tr3 is assumed to operate in a saturation region unless otherwise specified. In other words, the gate voltage, source voltage, and drain voltage of the transistor Tr3 are assumed to be appropriately biased to voltages in the range where the transistor operates in the saturation region. Note that even when the operation of the transistor Tr3 deviates from operation in an ideal saturation region, the gate voltage, source voltage, and drain voltage of the transistor Tr3 are regarded as being appropriately biased as long as the accuracy of an output current is within a desired range.

[Before Time T1]

Before Time T1, a low-level potential is applied to the wiring GL1 and the wiring GL2, and a high-level potential is applied to the wiring GL3. When the potential of the wiring GL1 is a low-level potential, a low-level potential is applied to the gates of the transistor Tr1 and the transistor Tr4; thus, the transistor Tr1 and the transistor Tr4 are set in off states. That is, the wiring DL and the node ND1 are electrically disconnected. Similarly, when the potential of the wiring GL2 is a low-level potential, a low-level potential is applied to the gate of the transistor Tr2; thus, the transistor Tr2 is set in an off state. That is, the wiring WDL and the node ND2 are electrically disconnected. In addition, when the potential of the wiring GL3 is a high-level potential, a high-level potential is applied to the gate of the transistor Tr5; thus, the transistor Tr5 is set in an on state. That is, the anode terminal of the light-emitting element LD and the first terminal of the transistor Tr5 are electrically connected.

Meanwhile, when a difference between the potential of the node ND2 and the potential of a source of the transistor Tr3 (gate-source voltage) is greater than the threshold voltage of the transistor Tr3, the transistor Tr3 is set in an on state, and a current flowing between the source and a drain of the transistor Tr3 is determined in accordance with the gate-source voltage of the transistor Tr3. In the case where the second terminal of the transistor Tr3 is the source at this time, the current flows from the wiring AL to the anode terminal of the light-emitting element LD through the transistor Tr3 and the transistor Tr5. Consequently, the light-emitting element LD emits light. Note that in the timing chart shown in FIG. 4, the potential of the node ND2 at which the transistor Tr3 is set in an off state is denoted as $V_0$ (that is, a difference between $V_0$ and the potential of the source of the transistor Tr3 is less than the threshold voltage of the transistor Tr3; thus, the light-emitting element LD does not emit light).

In addition, to briefly describe this operation example, the potential of the node ND1 before Time T1 is also set to $V_0$.

Assume that before Time T1, image data is not transmitted from the source driver circuit SD to the pixel PIX and $V_{GND}$ is applied to the wiring DL and the wiring WDL.

[Time T1]

At Time T1, a low-level potential is applied to the wiring GL3. Thus, in a period from Time T1 to Time T2, a low-level potential is applied to the gate of the transistor Tr5, so that the transistor Tr5 is set in an off state. Consequently, a current does not flow to the anode terminal of the light-emitting element LD regardless of whether the transistor Tr3 is in an on state or an off state, so that the light-emitting element LD does not emit light.

[Time T2]

At Time T2, a high-level potential is applied to the wiring GL1. Thus, in a period from Time T2 to Time T3, a high-level potential is applied to the gate of each of the transistor Tr1 and the transistor Tr4, so that the transistor Tr1 and the transistor Tr4 are set in on states.

When the transistor Tr1 is set in an on state, the wiring DL and the node ND1 are electrically connected. Thus, the potential of the node ND1 becomes $V_{GND}$. In addition, when the transistor Tr4 is set in an on state, the wiring VL and the second terminal of the capacitor C2 are electrically connected. Thus, the potential of the second terminal of the capacitor C2 becomes $V_{GND}$.

In addition, the second terminal of the capacitor C1 (the node ND2) is in a floating state; thus, when the potential of the node ND1 changes, the potential of the node ND2 also changes due to capacitive coupling. Note that the amount of change in the potential of the node ND2 depends on the amount of change in the potential of the node ND1, the capacitance of the capacitor C1, and the like. In this operation example, the potential of the node ND1 decreases from $V_0$ to $V_{GND}$; accordingly, the potential of the node ND2 decreases from $V_0$.

[Time T3]

At Time T3, a high-level potential is applied to the wiring GL2. Thus, in a period from Time T3 to Time T4, a high-level potential is applied to the gate of the transistor Tr2, so that the transistor Tr2 is set in an on state.

When the transistor Tr2 is set in an on state, the wiring WDL and the node ND2 are electrically connected. Thus, the potential of the node ND2 becomes $V_{GND}$. Note that since the transistor Tr1 is in an on state, the potential of the node ND1 is not changed by a change in the potential of the node ND2. Similarly, since the transistor Tr4 is in an on state, the potential of the second terminal of the capacitor C2 is also not changed by a change in the potential of the node ND2.

[Time T4]

At Time T4, an analog signal is transmitted as image data from the source driver circuit SD to the wiring DL and the wiring WDL. Here, $V_{data}$ is input as the potential of the analog signal to the wiring DL and the wiring WDL.

Since the transistor Tr1 is in an on state, $V_{data}$ is applied from the wiring DL to the first terminal of the capacitor C1 (the node ND1). In addition, the transistor Tr2 is also in an on state; thus, $V_{data}$ is applied from the wiring WDL to the gate of the transistor Tr3, the second terminal of the capacitor C1, and the first terminal of the capacitor C2 (the node ND2). Note that the potential of the second terminal of the capacitor C2 is not changed by changes in the potentials of the node ND1 and the node ND2 because the transistor Tr4 is in an on state.

[Time T5]

At Time T5, a low-level potential is applied to the wiring GL2. Thus, in a period from Time T5 to Time T6, a low-level potential is applied to the gate of the transistor Tr2, so that the transistor Tr2 is set in an off state.

When the transistor Tr2 is set in an off state, the wiring WDL and the node ND2 are electrically disconnected. Thus, the node ND2 is brought into a floating state.

[Time T6]

At Time T6, a signal that is obtained by adding the potential of $\Delta V_{data}$ to the potential $V_{data}$ input in a period from Time T4 to Time T5 is transmitted from the source driver circuit SD to the wiring DL and the wiring WDL. That is, the potentials of the wiring DL and the wiring WDL are $V_{data} + \Delta V_{data}$.

Since the transistor Tr1 is in an on state, $V_{data}+\Delta V_{data}$ is applied from the wiring DL to the node ND1. That is, the potential of the node ND1 changes from $V_{data}$ in the period from Time T4 to Time T6 to $V_{data}+\Delta V_{data}$.

Since the transistor Tr2 is in an off state, $V_{data}+\Delta V_{data}$ is not applied from the wiring WDL to the node ND2. However, the potential of the node ND1 changes from $V_{data}$ to $V_{data}+\Delta V_{data}$ and the node ND2 is in a floating state; thus, the change in the potential of the node ND1 causes a change in the potential of the node ND2 due to the capacitive coupling of the capacitor C1. In the timing chart of FIG. 4, the amount of change in the potential of the node ND2 is denoted as $\Delta V_g$, and $\Delta V_g$ can be estimated by Equation (E1) below.

[Equation 1]

$$\Delta V_g = \frac{C_1}{C_1 + C_2} \Delta V_{data} \quad (E1)$$

Therefore, when the potential of the node ND2 is $V_{ND2}$, the capacitance of the capacitor C1 is $C_1$, and the capacitance of the capacitor C2 is $C_2$, $V_{ND2}$ can be expressed by Equation (E2) below.

[Equation 2]

$$V_{ND2} = V_{data} + \frac{C_1}{C_1 + C_2} \Delta V_{data} \quad (E2)$$

Note that although the potential of the wiring WDL is $V_{data}+\Delta V_{data}$ at Time T6, $V_{data}+\Delta V_{data}$, the potential of the wiring WDL, is not input to any element in the circuit configuration example illustrated in FIG. 2A. For this reason, in the circuit configuration example illustrated in FIG. 2A, the potential of the wiring WDL does not have to be $V_{data}+\Delta V_{data}$ at Time T6.

[Time T7]

At Time T7, a low-level potential is applied to the wiring GL1. Thus, in a period from Time T7 to Time T8, a low-level potential is applied to the gate of the transistor Tr1, so that the transistor Tr1 is set in an off state. Consequently, the node ND1 is brought into a floating state, and the potential of the node ND1 is held by the capacitor C1.

In addition, in the period from Time T7 to Time T8, a low-level potential is applied to the gate of the transistor Tr4, so that the transistor Tr4 is set in an off state. At this time, the potential of the second terminal of the capacitor C2 is $V_{GND}$ and the potential of the gate of the transistor Tr3 (the node ND2) is $V_{ND2}$; thus, in the case where $V_{ND2}-V_{GND}$ is higher than the threshold voltage, the transistor Tr3 is set in an on state. Furthermore, the current flowing between the source and the drain of the transistor Tr3 is determined in accordance with $V_{ND2}-V_{GND}$.

[Time T8]

At Time T8, a high-level potential is applied to the wiring GL3. Thus, after Time T8, a high-level potential is applied to the gate of the transistor Tr5, so that the transistor Tr5 is set in an on state. Accordingly, a current flowing from the wiring AL is input to the anode terminal of the light-emitting element LD through the transistor Tr3 and the transistor Tr5, so that the light-emitting element LD emits light. At this time, a voltage is applied between the anode terminal and the cathode terminal of the light-emitting element LD and a predetermined potential is applied to the wiring CAT, so that the potential of an electrical connection point of the second terminal of the transistor Tr3, the first terminal of the transistor Tr4, the first terminal of the transistor Tr5, and the second terminal of the capacitor C2 increases. In addition, since the node ND1 and the node ND2 are each in a floating state, when the potential of the electrical connection point increases, the potentials of the node ND1 and the node ND2 also increase due to capacitive coupling in some cases. In the timing chart of FIG. 4, the potentials of the node ND1 and the node ND2 after Time T8 are higher than the potentials of the node ND1 and the node ND2 in the period from Time T7 to Time T8.

Note that the luminance of the light-emitting element LD is determined by the current flowing to the light-emitting element LD. According to Kirchhoff's law, the current flowing to the light-emitting element LD is substantially equal to the current flowing between the source and the drain of the transistor Tr3; thus, the luminance of the light-emitting element LD is determined by the gate-source voltage of the transistor Tr3.

As described above, the operations in the period from Time T1 to Time T8 and at the time close to the period in the timing chart of FIG. 4 are performed on the pixel PIX illustrated in FIG. 2A, so that a potential with higher resolution than that of the digital-analog converter circuit DAC can be applied to the image data retention portion (the node ND2) of the pixel PIX.

Specific Example

Here, a description is made on an example of displaying multi-tone image data compared to image data output from the digital-analog converter circuit DAC on the display portion PA of the display device DD according to the operation example described above.

In this example, a 6-bit digital-analog converter circuit is provided as the digital-analog converter circuit DAC of the source driver circuit SD, and the capacitance ratio of the capacitor C1 to the capacitor C2 included in the pixel PIX is set to $C_1:C_2=1:15$.

By using a 6-bit digital-analog converter circuit DAC as the digital-analog converter circuit DAC, $V_{data}$ that is written to the node ND1 and the node ND2 of the pixel PIX can have a value ranging from "000000" to "111111" in binary notation. Here, when the voltage value of "111111" is 6.3 V, the voltage value possible for $V_{data}$ that can be output from the digital-analog converter circuit DAC is in the range of 0 V to 6.3 V in 0.1 V steps.

Thus, in the operation example described above, $V_{data}$ in the range of 0 V to 6.3 V can be written to the node ND1 and the node ND2 of the pixel PIX in the period from Time T4 to Time T5.

[In the Case where $V_{data}$ has a Value in the Range of 0 V to 4.8 V]

First, the case is described in which $V_{data}$ in the range of 0 V to 4.8 V (in the range of "000000" to "110000" in binary notation) is written to the node ND1 and the node ND2 of the pixel PIX.

Since the capacitance ratio of the capacitor C1 to the capacitor C2 is $C_1:C_2=1:15$, Equation (E1) is represented by Equation (E3) below.

[Equation 3]

$$\Delta V_g = \frac{1}{16}\Delta V_{data} = \frac{1}{2^4}\Delta V_{data} \quad (E3)$$

Here, $\Delta V_{data}$ is assumed to be able to have a value ranging from "000000" to "001111" in binary notation, for example. In this case, a voltage value that $\Delta V_{data}$ can have is in the range of 0 V to 1.5 V in 0.1 V steps. That is, from Equation (E3), $\Delta V_g$ can have a value ranging from 0 V to 0.09375 V in 0.00625 V steps.

Thus, in the operation example described above, the potential of the node ND2 of the pixel PIX can have a value ranging from 0 V to 4.8+0.09375 V in 0.00625 V steps from Equation (E2) and Equation (E3), in a period from Time T6 to Time T7.

[In the Case where $V_{data}$ has a Value in the Range of 4.9 V to 6.3 V]

Next, the case is described in which $V_{data}$ in the range of 4.9 V to 6.3 V (in the range of "110001" to "111111" in binary notation) is written to the node ND1 and the node ND2 of the pixel PIX.

The capacitance ratio of the capacitor C1 to the capacitor C2 is the same as that when $V_{data}$ has a value in the range of 0 V to 4.8 V; thus, Equation (E3) can also be used in this case.

Here, $\Delta V_{data}$ is assumed to have a voltage value in the range of −1.5 V to 0 V in 0.1 V steps, for example. That is, $\Delta V_{data}$ is assumed to be a negative value and $V_{data}+\Delta V_{data}$ is assumed to be able to have a value in the range of 3.4 V to 6.3 V (in the range of "100010" to "111111" in binary notation).

In this case, from Equation (E3), $\Delta V_g$ can have a value in the range of −0.09375 V to 0 V in 0.00625 V steps.

Thus, in the operation example described above, the potential of the node ND2 of the pixel PIX can have a value in the range of 4.9-0.09375 V to 6.3 V in 0.00625 V steps from Equation (E2) and Equation (E3), in the period from Time T6 to Time T7.

The above specific example is summarized as follows. When a (6-bit) digital-analog converter circuit capable of outputting an analog value in the range of 0 V to 6.3 V in 0.1 V steps is provided as the digital-analog converter circuit DAC and the capacitance ratio of the capacitor C1 to the capacitor C2 included in the pixel PIX is set to $C_1:C_2=1:15$, a potential in the range of 0 V to 6.3 V can be applied to the node ND2 in 0.00625 V steps.

That is, by performing the above operation example in the pixel PIX illustrated in FIG. 2A, a finer voltage value, which cannot be output from the 6-bit digital-analog converter circuit DAC, can be applied to the node ND2. In the above specific example, the digital-analog converter circuit DAC outputs a potential in 0.1 V steps; however, a potential can be written to the node ND2 of the pixel PIX in 0.00625 V steps. In other words, a potential (image data) with higher resolution than that of the 6-bit digital-analog converter circuit DAC can be written to the pixel PIX.

In the above specific example, $\Delta V_{data}$ supplied by the 6-bit digital-analog converter circuit DAC corresponds to high-order 6 bits of image data, and $\Delta V_g$ that is added to the node ND2 through capacitive coupling of the pixel PIX corresponds to low-order 4 bits of image data. That is, the pixel PIX in FIG. 2A can complement lower 4 bits of image data to higher 6 bits of image data supplied from the digital-analog converter circuit DAC.

Note that the configuration of the pixel PIX of one embodiment of the present invention and the configurations of the wirings electrically connected to the pixel PIX are not limited to those illustrated in FIG. 2A. In one embodiment of the present invention, components of the pixel PIX and each wiring can be changed as appropriate depending on conditions such as design specifications and objectives, for example.

In a specific example, at least one of the transistor Tr1 to the transistor Tr5 included in the pixel PIX in FIG. 2A may be a transistor with a back gate. The threshold voltage of the transistor can be increased or decreased when a potential is applied to the back gate of the transistor.

Figure 2B:
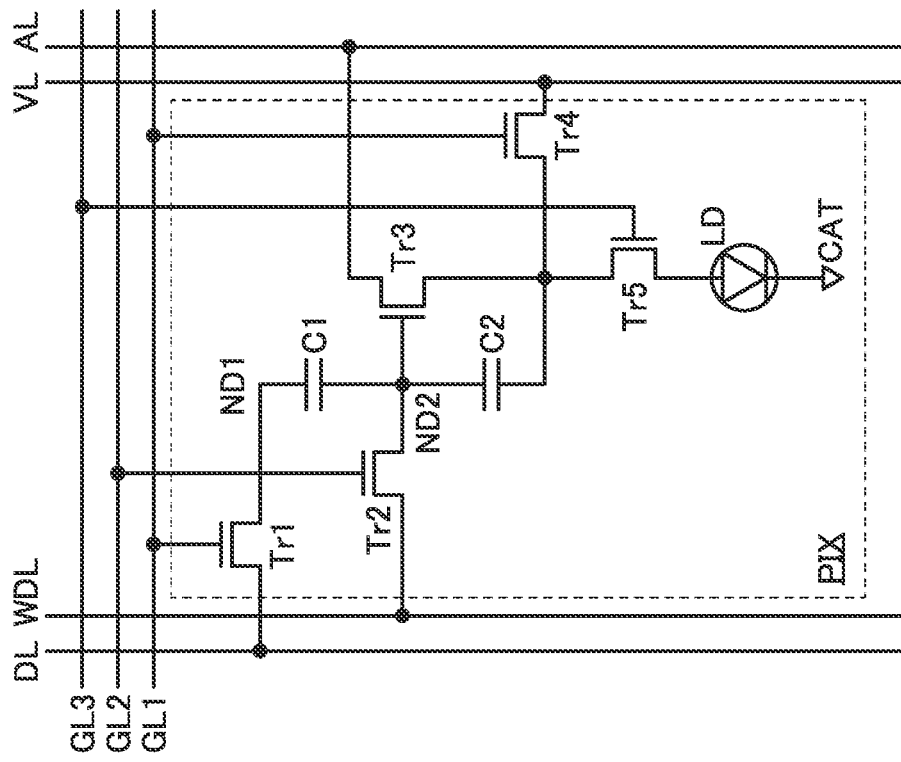

In addition, electrically connecting a gate and a back gate of the transistor can further increase the amount of source-drain current that flows when the transistor is in an on state. FIG. 2B illustrates a configuration in which each of the transistor Tr1 to the transistor Tr5 included in the pixel PIX in FIG. 2A is a transistor with a back gate and a gate and a back gate of each of the transistors are electrically connected to each other.

Figure 3:
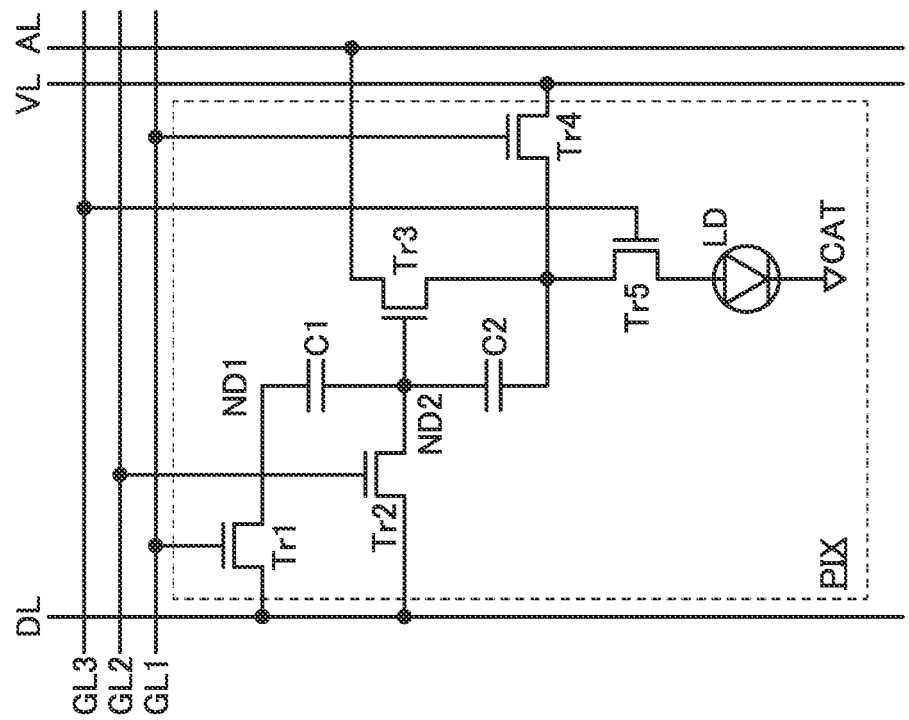
FIG. 3 is a circuit diagram illustrating a pixel example.

In addition, in another specific example, one wiring may double as the wiring DL and the wiring WDL (see FIG. 3). Note that the above operation example is referred to for an operation method of the pixel PIX illustrated in FIG. 3.

Furthermore, this embodiment illustrates FIG. 2A, FIG. 2B, and FIG. 3 as other specific examples where a pixel circuit includes a light-emitting element such as an EL element; however, one embodiment of the present invention is not limited thereto. In one embodiment of the present invention, for example, a configuration may be employed in which a capacitor is also provided for a pixel circuit including a liquid crystal element like FIG. 2A, FIG. 2B, and FIG. 3, the potential of one terminal of the liquid crystal element is increased or decreased by capacitive coupling, and a finer analog value than the resolution of the digital-analog converter circuit DAC is supplied.

Figure 5A:
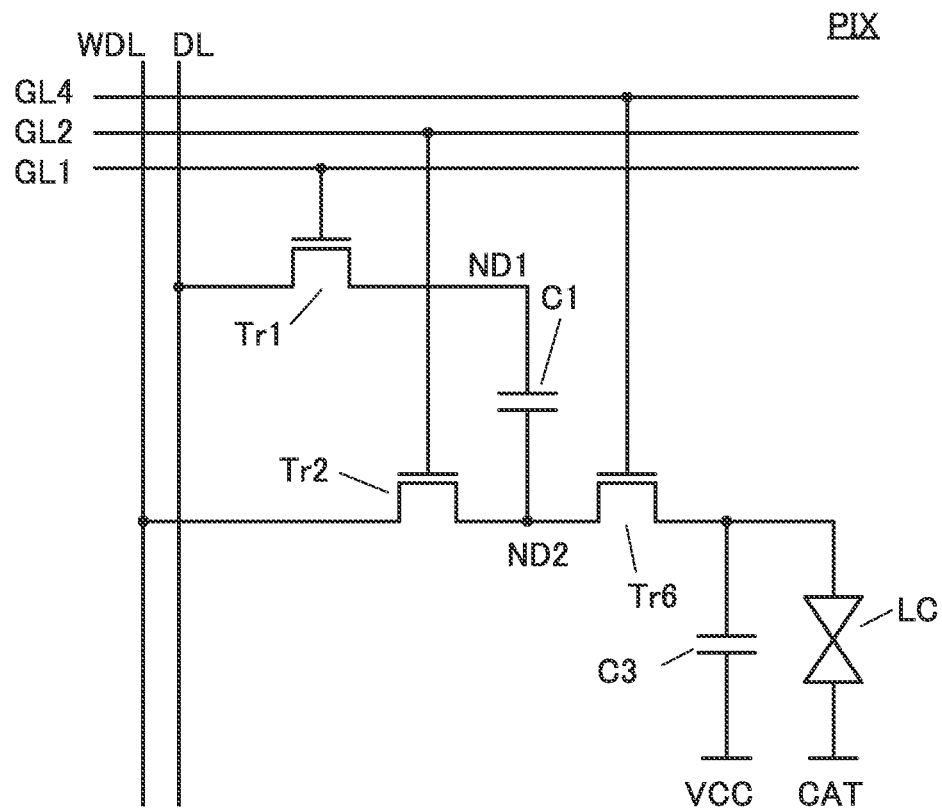
FIG. 5A to FIG. 5C are circuit diagrams each illustrating a pixel example.

FIG. 5A illustrates an example in which a liquid crystal element LC is used as a display element. Note that portions different from those described above are mainly described below, and the above descriptions can be referred to for repeating portions.

The pixel PIX illustrated in FIG. 5A includes the transistor Tr1, the transistor Tr2, a transistor Tr6, the capacitor C1, a capacitor C3, and the liquid crystal element LC. In addition, the wiring GL1, the wiring GL2, a wiring GL4, the wiring DL, the wiring WDL, a wiring VCC, and the wiring CAT are connected to the pixel PIX.

A gate of the transistor Tr6 is electrically connected to the wiring GL4; one of a source and a drain of the transistor Tr6 is electrically connected to the node ND2; and the other of the source and the drain of the transistor Tr6 is electrically connected to one electrode of the capacitor C3 and one electrode of the liquid crystal element LC. The other electrode of the capacitor C3 is electrically connected to the wiring VCC. The other electrode of the liquid crystal element LC is electrically connected to the wiring CAT.

The wiring VCC is a wiring for applying a predetermined potential to the other electrode of the capacitor C3. As a potential applied to the wiring VCC, a fixed potential such as a common potential, a reference potential, or a ground potential can be applied, for example. A configuration may be employed in which the wiring VCC and the wiring CAT are common and supplied with the same potential.

The transistor Tr6 can function as a switch that controls the operation of the liquid crystal element LC. In the case where a signal written from the wiring WDL to the node ND2 is higher than the threshold voltage for operating the liquid crystal element LC, the liquid crystal element LC sometimes operates before an image signal is written from the wiring DL. Thus, it is preferable to provide the transistor Tr6, bring the transistor Tr6 into conduction by a signal supplied to the wiring GL4 after the potential of the node ND2 is determined, and operate the liquid crystal element LC.

Figure 5B:
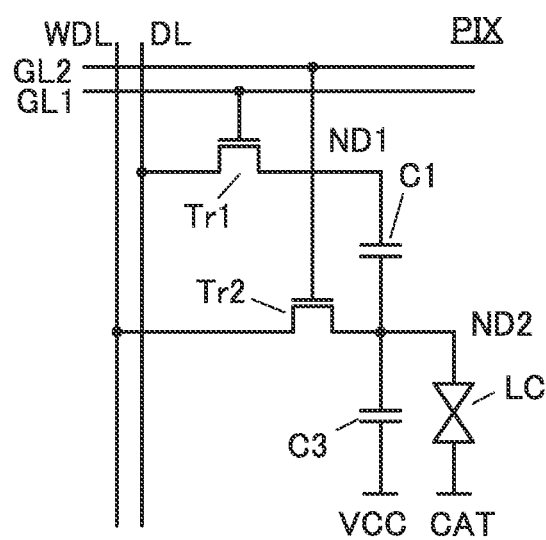

The configuration of the pixel PIX illustrated in FIG. 5B is obtained by omission of the transistor Tr6 and the wiring GL4 from the configuration illustrated in FIG. 5A.

The transistor Tr6 in FIG. 5A is a switch that prevents unintended operation of the liquid crystal element LC; however, the transistor Tr6 can be omitted when visual recognition of the operation of the liquid crystal element LC can be prevented even if the liquid crystal element LC operates. For example, operation such as turning off a backlight in a period during which a signal is supplied from the wiring WDL to the node ND2 may be used in combination.

Figure 5C:
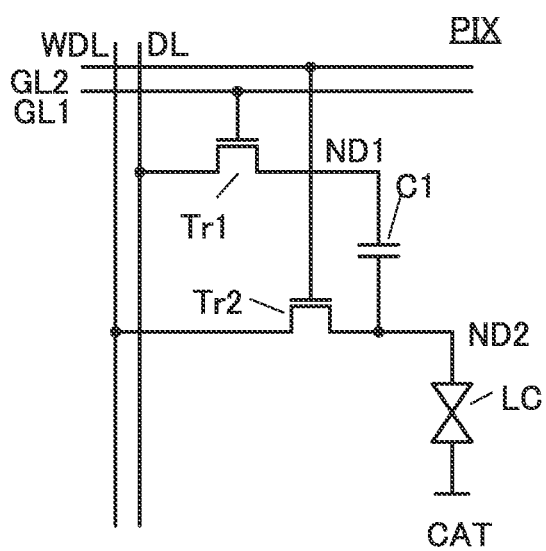

Alternatively, as illustrated in FIG. 5C, a configuration in which the capacitor C3 is omitted may be employed. An OS transistor can be used as the transistor connected to the node ND2. Since an OS transistor has an extremely low leakage current in an off state, image data can be retained for a comparatively long time even when the capacitor C3 functioning as a storage capacitor is omitted.

In addition, this configuration is also effective when frame frequency is high and a period for retaining image data is comparatively short (e.g., field sequential driving). The aperture ratio can be improved by omitting the capacitor C3. Alternatively, the transmittance of the pixel can be improved. Note that the configuration in which the capacitor C3 is omitted may be employed in the configuration of another pixel circuit illustrated in this specification.

Figure 6A:
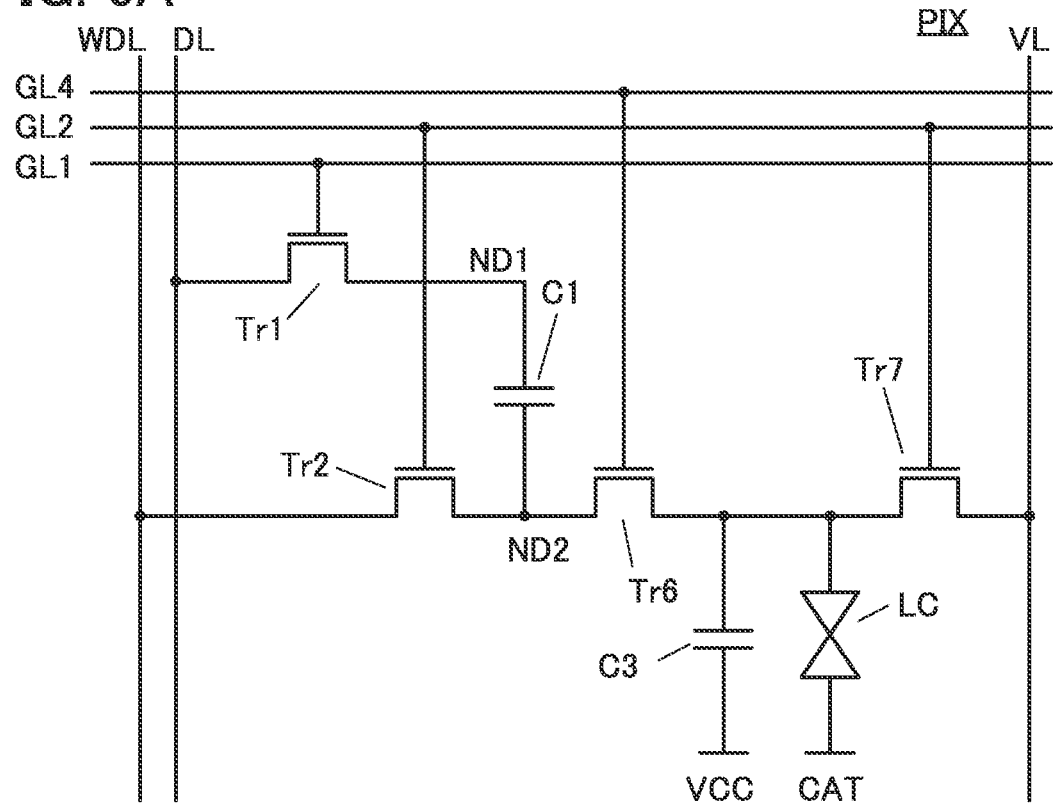
FIG. 6A and FIG. 6B are circuit diagrams each illustrating a pixel example.

Furthermore, the pixel PIX illustrated in FIG. 6A is obtained by addition of a transistor Tr7 and the wiring VL to the configuration in FIG. 5A.

In the configuration illustrated in FIG. 6A, the reset operation of the liquid crystal element LC can be performed by supplying a reset potential to the wiring VL and bringing the transistor Tr7 into conduction. With the configuration, operations of rewriting the potential of the node ND2 and a potential applied to the liquid crystal element LC can be controlled independently, and thus a period for the display operation of the liquid crystal element LC can be lengthened.

In addition, in the case where display with low gray levels is performed, the display operation of the liquid crystal element LC may be performed by supplying an image signal from the wiring VL and controlling the conduction and non-conduction of the transistor Tr7. In that case, the transistor Tr6 is always nonconducting.

Figure 6B:
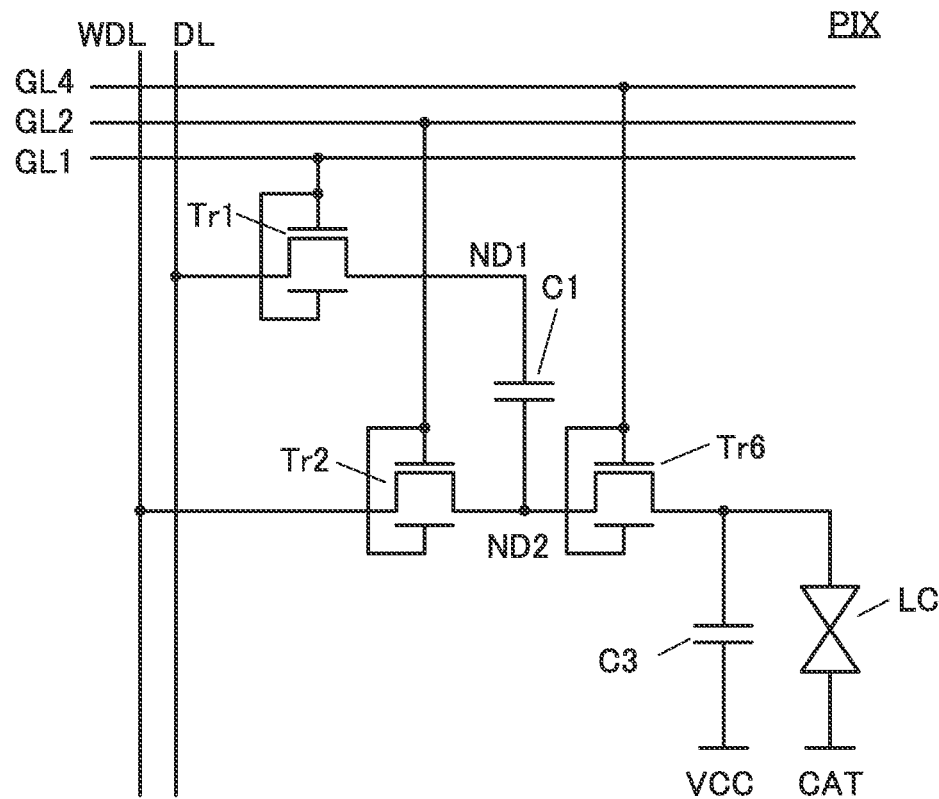

The pixel PIX illustrated in FIG. 6B has a configuration in which each transistor is provided with a back gate. The back gate is electrically connected to a front gate and has an effect of increasing an on-state current. In addition, a configuration may be employed in which a fixed potential which is different from that of the front gate can be supplied to the back gate. In such a configuration, the threshold voltage of the transistor can be controlled. Note that although all of the transistors have back gates in FIG. 6B, a transistor without a back gate may be included. Furthermore, a configuration in which a transistor includes a back gate is also effective for another pixel circuit in this embodiment.

The above is the description of the configuration examples in which the liquid crystal element is used.

One embodiment of the present invention disclosed in this specification and the like is a semiconductor device including first to third transistors and first and second capacitors. A first terminal of the first transistor is electrically connected to a first terminal of the first capacitor; a first terminal of the second transistor is electrically connected to a gate of the third transistor, a second terminal of the first capacitor, and a first terminal of the second capacitor; and a first terminal of the third transistor is electrically connected to a second terminal of the second capacitor. The semiconductor device has the following first function to fourth function. The first function has functions of setting the first transistor in an on state and writing a first potential to the first terminal of the first capacitor, and functions of setting the second transistor in an on state and writing the first potential to the gate of the third transistor, the second terminal of the first capacitor, and the second terminal of the second capacitor. The second function has functions of setting the second transistor in an off state and retaining the gate potential of the third transistor by the second terminal of the first capacitor and the second terminal of the second capacitor. The third function has a function of writing the sum of the first potential and a third potential to the first terminal of the first capacitor, and a function of changing the first potential retained by the gate of the third transistor, the second terminal of the first capacitor, and the first terminal of the second capacitor into the sum of the first potential and a fourth potential by writing the sum of the first potential and the third potential to the first terminal of the first capacitor. The fourth function has a function of supplying a current corresponding to the sum of the first potential and the fourth potential between the first terminal and the second terminal of the third transistor.

In addition, in the above, at least one of the first to third transistors preferably includes a metal oxide in a channel formation region.

Furthermore, in the above, a fourth transistor and a light-emitting element are preferably included. In that case, a first terminal of the fourth transistor is preferably electrically connected to the first terminal of the third transistor and the second terminal of the second capacitor, and an anode terminal of the light-emitting element is preferably electrically connected to a second terminal of the fourth transistor.

Furthermore, in the above, the fourth transistor preferably includes a metal oxide in a channel formation region.

Furthermore, in the above, it is preferable that the first potential correspond to high-order bit data and that the fourth potential correspond to low-order bit data.

Another embodiment of the present invention is a display device including the semiconductor device with the above configuration and a digital-analog converter circuit. In that case, an output terminal of the digital-analog converter circuit is preferably electrically connected to the first terminal of the first transistor and the first terminal of the second transistor, and the digital-analog converter circuit preferably has functions of generating the first potential or the sum of the first potential and the third potential and outputting the first potential or the sum of the first potential and the third potential from the output terminal of the digital-analog converter circuit.

Another embodiment of the present invention is an electronic device including the display device with the above structure and a housing.

In addition, an operation method of a semiconductor device or a display device of one embodiment of the present invention is not limited to the above operation example or specific example. In the operation method, the sequence of applying a potential to an element, a circuit, a wiring, or the like and the value of the potential can be changed as appropriate, for example. In addition, as described above, the structure of the semiconductor device or the display device of one embodiment of the present invention can be changed as appropriate; thus, the operation method of the semiconductor device or the display device may also be changed depending on the structure.

At least part of this embodiment can be implemented in combination with the other embodiments described in this specification as appropriate.

Embodiment 2

In this embodiment, structure examples of a display device will be described.

Figure 7A:
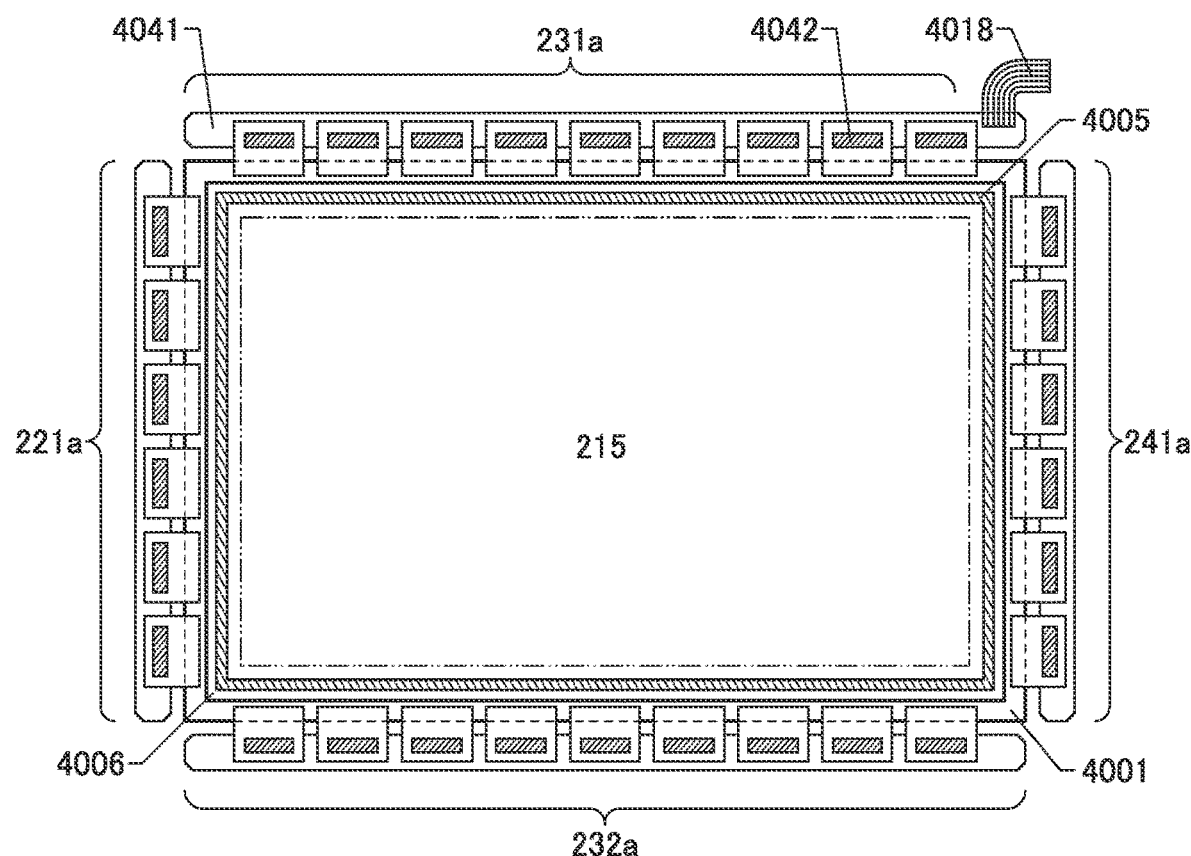
FIG. 7A and FIG. 7B are top views each illustrating a display device example.

In FIG. 7A, a sealant 4005 is provided to surround a display portion 215 provided over a first substrate 4001, and the display portion 215 is sealed with the sealant 4005 and a second substrate 4006.

A pixel array including the pixels PIX described in Embodiment 1 is provided in the display portion 215.

In FIG. 7A, a scan line driver circuit 221a, a signal line driver circuit 231a, a signal line driver circuit 232a, and a common line driver circuit 241a each include a plurality of integrated circuits 4042 provided over a printed board 4041. The integrated circuits 4042 are formed using a single crystal semiconductor or a polycrystalline semiconductor. The signal line driver circuit 231a and the signal line driver circuit 232a each have a function of the source driver circuit SD described in Embodiment 1. The scan line driver circuit 221a has a function of the gate driver circuit GD described in Embodiment 1. The common line driver circuit 241a has a function of supplying a predetermined potential to the wiring CAT described in Embodiment 1.

A variety of signals and potentials are supplied to the scan line driver circuit 221a, the common line driver circuit 241a, the signal line driver circuit 231a, and the signal line driver circuit 232a through an FPC 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying an image signal to the display portion 215. The integrated circuits 4042 are mounted on regions different from a region surrounded by the sealant 4005 over the first substrate 4001.

Note that there is no particular limitation on the connection method of the integrated circuits 4042; a wire bonding method, a COG method, a TCP method, a COF (Chip On Film) method, or the like can be used.

Figure 7B:
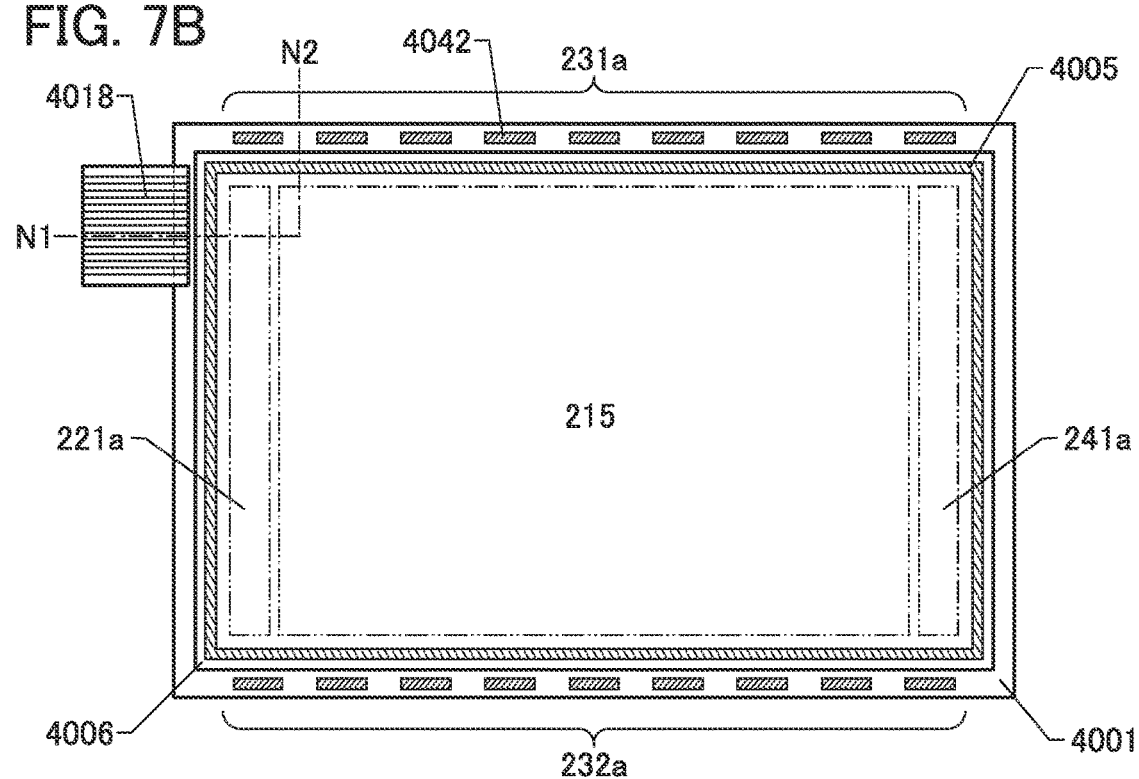

FIG. 7B illustrates an example of mounting the integrated circuits 4042 included in the signal line driver circuit 231a and the signal line driver circuit 232a by a COG method. Some or all of the driver circuits are provided over the same substrate as the display portion 215, so that a system-on-panel can be achieved.

In the example illustrated in FIG. 7B, the scan line driver circuit 221a and the common line driver circuit 241a are formed over the same substrate as the display portion 215. When the driver circuits are formed over the same substrate as the display portion 215 through the same step, the number of components can be reduced. Accordingly, productivity can be increased.

In addition, in FIG. 7B, the sealant 4005 is provided to surround the display portion 215, the scan line driver circuit 221a, and the common line driver circuit 241a that are provided over the first substrate 4001. Furthermore, the second substrate 4006 is provided over the display portion 215, the scan line driver circuit 221a, and the common line driver circuit 241a. Consequently, the display portion 215, the scan line driver circuit 221a, and the common line driver circuit 241a are sealed together with a display element by the first substrate 4001, the sealant 4005, and the second substrate 4006.

In addition, although the signal line driver circuit 231a and the signal line driver circuit 232a are formed separately and mounted on the first substrate 4001 in the example illustrated in FIG. 7B, one embodiment of the present invention is not limited to this structure. A scan line driver circuit may be formed separately and mounted, or part of a signal line driver circuit or part of a scan line driver circuit may be formed separately and mounted.

In addition, the display device sometimes includes a panel in which a display element is sealed, and a module in which an IC or the like including a controller is mounted on the panel.

Furthermore, the display portion 215 and the scan line driver circuit 221a provided over the first substrate 4001 each include a plurality of transistors. An OS transistor or a Si transistor can be applied to each of the transistors.

A transistor included in a peripheral driver circuit and a transistor included in the pixel circuit of the display portion 215 may have the same structure or different structures. All the transistors included in the peripheral driver circuit may have the same structure or may use the combination of two or more kinds of structures. Similarly, all the transistors included in the pixel circuit may have the same structure or may use the combination of two or more kinds of structures.

In addition, an input device 4200 to be described later can be provided over the second substrate 4006. The structure where the display device illustrated in FIG. 7A or FIG. 7B is provided with the input device 4200 can function as a touch panel.

There is no limitation on a sensor element included in a touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive type include a surface capacitive type and a projected capacitive type. In addition, examples of the projected capacitive type include a self-capacitive type and a mutual capacitive type. The use of a mutual capacitive type is preferred because multiple points can be sensed simultaneously.

The touch panel of one embodiment of the present invention can employ a variety of structures such as a structure in which a display device and a sensor element that are separately manufactured are attached to each other and a structure in which electrodes and the like included in a sensor element are provided on one or both of a substrate supporting a display element and a counter substrate.

Figure 8A:
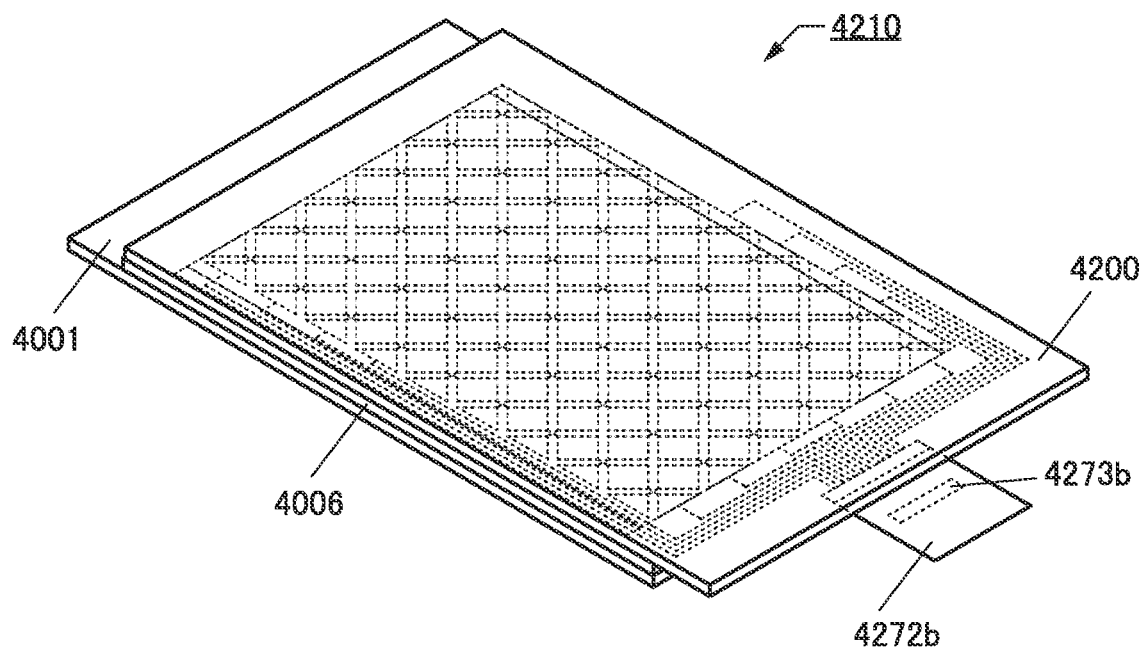
FIG. 8A and FIG. 8B are perspective views illustrating a touch panel example.
Figure 8B:
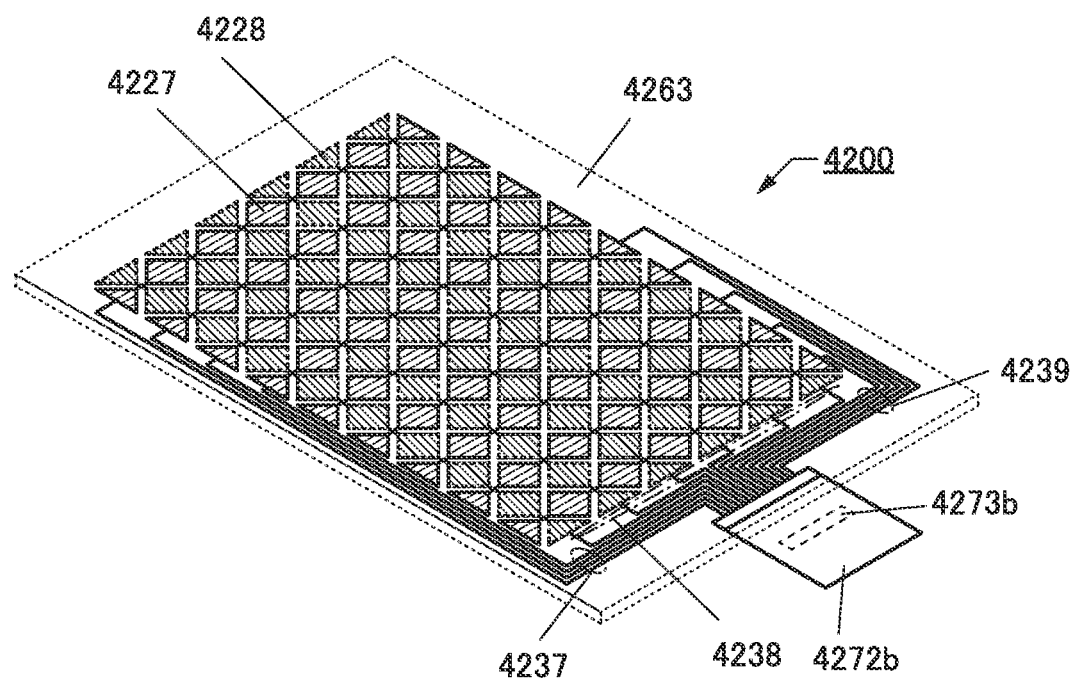

FIG. 8A and FIG. 8B illustrate an example of a touch panel. FIG. 8A is a perspective view of a touch panel 4210. FIG. 8B is a schematic perspective view of the input device 4200. Note that for clarity, only typical components are illustrated.

The touch panel 4210 has a structure in which a display device and an input device that are separately manufactured are attached to each other.

The touch panel 4210 includes the input device 4200 and a display device that are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4238. An FPC 4272b is electrically connected to each of the plurality of wirings 4237, the plurality of wirings 4238, and the plurality of wirings 4239. An IC 4273b can be provided on the FPC 4272b.

Alternatively, a touch sensor may be provided between the first substrate 4001 and the second substrate 4006 in the display device. When a touch sensor is provided between the first substrate 4001 and the second substrate 4006, an optical touch sensor using a photoelectric conversion element as well as a capacitive touch sensor may be employed.

Figure 9:
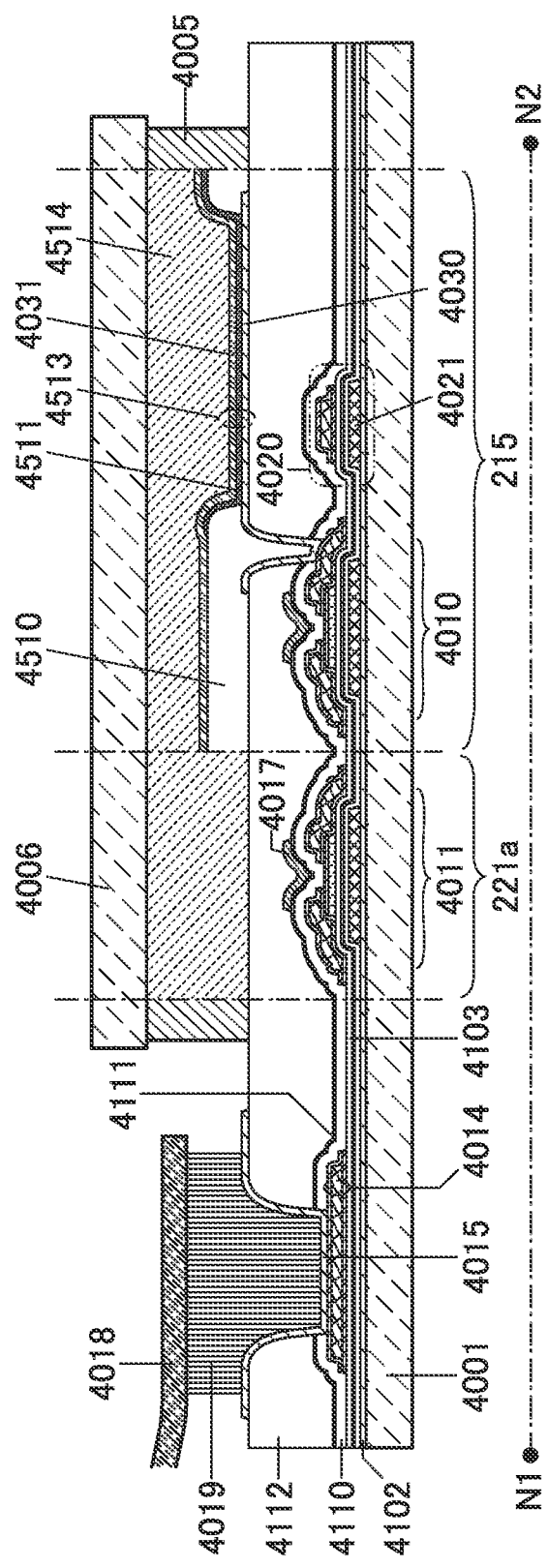
FIG. 9 is a cross-sectional view of a display device example.

FIG. 9 is a cross-sectional view corresponding to a portion indicated by chain line N1-N2 in FIG. 7B. A display device illustrated in FIG. 9 includes an electrode 4015. The electrode 4015 is electrically connected to a terminal included in the FPC 4018 through an anisotropic conductive layer 4019. Furthermore, in FIG. 9, the electrode 4015 is electrically connected to a wiring 4014 in an opening formed in an insulating layer 4112, an insulating layer 4111, and an insulating layer 4110.

The electrode 4015 is formed using the same conductive layer as a first electrode layer 4030, and the wiring 4014 is formed using the same conductive layer as source electrodes and drain electrodes of a transistor 4010 and a transistor 4011.

In addition, the display portion 215 and the scan line driver circuit 221a that are provided over the first substrate 4001 each include a plurality of transistors. In FIG. 9, the transistor 4010 included in the display portion 215 and the transistor 4011 included in the scan line driver circuit 221a are illustrated as examples. Note that in the example illustrated in FIG. 9, the transistor 4010 and the transistor 4011 are bottom-gate transistors but may be top-gate transistors. Furthermore, the transistor 4011 can be a transistor included in the gate driver circuit GD described in Embodiment 1.

In FIG. 9, the insulating layer 4112 is provided over the transistor 4010 and the transistor 4011. In addition, a partition 4510 is formed over the insulating layer 4112.

Furthermore, the transistor 4010 and the transistor 4011 are provided over an insulating layer 4102. Moreover, the transistor 4010 and the transistor 4011 each include an electrode 4017 formed over the insulating layer 4111. The electrode 4017 can function as a back gate electrode.

The display device illustrated in FIG. 9 further includes a capacitor 4020. The capacitor 4020 includes an electrode 4021 formed in the same step as a gate electrode of the transistor 4010, and an electrode formed in the same step as a source electrode and a drain electrode of the transistor 4010. The electrodes overlap with each other with an insulating layer 4103 therebetween. Note that the capacitor 4020 can be the capacitor C1, the capacitor C2, or the like of the pixel PIX described in Embodiment 1, for example.

The capacitance of a capacitor provided in a pixel portion of a display device is set in consideration of the leakage current or the like of a transistor provided in the pixel portion so that electric charge can be retained for a predetermined period. The capacitance of the capacitor may be set in consideration of the off-state current or the like of the transistor.

The transistor 4010 provided in the display portion 215 is electrically connected to the display element.

The display device illustrated in FIG. 9 further includes the insulating layer 4111 and the insulating layer 4102. As the insulating layer 4111 and the insulating layer 4102, insulating layers through which impurity elements do not easily pass are used. The transistor is sandwiched between the insulating layer 4111 and the insulating layer 4102, so that entry of impurities into a semiconductor layer from the outside can be prevented.

A light-emitting element utilizing electroluminescence (EL element) can be used as the display element included in the display device. An EL element includes a layer containing a light-emitting compound (also referred to as an "EL layer") between a pair of electrodes. By generating a potential difference that is greater than the threshold voltage of the EL element between the pair of electrodes, holes are injected from an anode side to the EL layer and electrons are injected from a cathode side to the EL layer. The injected electrons and holes are recombined in the EL layer, and a light-emitting substance contained in the EL layer emits light.

Furthermore, EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. The carriers (electrons and holes) are then recombined; thus, a light-emitting organic compound forms an excited state, and light is emitted when the excited state returns to a ground state. Owing to such a mechanism, such a light-emitting element is referred to as a current-excitation light-emitting element.

Note that in addition to the light-emitting compound, the EL layer may include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that the description is made here using an organic EL element as a light-emitting element.

In order to extract light emitted from the light-emitting element, at least one of the pair of electrodes is transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 9 is an example of a light-emitting display device using a light-emitting element as a display element (also referred to as an "EL display device"). A light-emitting element 4513 that is a display element is electrically connected to the transistor 4010 provided in the display portion 215. That is, the transistor 4010 corresponds to the transistor Tr5 described in Embodiment 1, and the light-emitting element 4513 corresponds to the light-emitting element LD described in Embodiment 1. Note that the structure of the light-emitting element 4513 is a stacked-layer structure of the first electrode layer 4030, a light-emitting layer 4511, and the second electrode layer 4031; however, the structure is not limited thereto. The structure of the light-emitting element 4513 can be changed as appropriate depending on, for example, the direction in which light is extracted from the light-emitting element 4513.

The partition 4510 is formed using an organic insulating material or an inorganic insulating material. It is particularly preferable that a photosensitive resin material be used, and that an opening portion be formed over the first electrode layer 4030 such that a side surface of the opening portion is formed to be an inclined surface having continuous curvature.

The light-emitting layer 4511 may be formed using a single layer or may be formed such that a plurality of layers are stacked.

The emission color of the light-emitting element 4513 can be white, red, green, blue, cyan, magenta, yellow, or the like depending on the material included in the light-emitting layer 4511.

Examples of a method for achieving color display include a method in which the light-emitting element 4513 whose emission color is white is combined with a coloring layer and a method in which the light-emitting element 4513 with a different emission color is provided in each pixel. The latter method, which requires separate formation of the light-emitting layer 4511 pixel by pixel, is less productive than the former method. However, the latter method enables higher color purity of the emission color than the former method. When the light-emitting element 4513 has a microcavity structure in addition to the latter method, the color purity can be further increased.

Note that the light-emitting layer 4511 may contain an inorganic compound such as quantum dots. For example, when quantum dots are used for the light-emitting layer, the quantum dots can function as a light-emitting material.

A protective layer may be formed over the second electrode layer 4031 and the partition 4510 in order to prevent entry of oxygen, hydrogen, moisture, carbon dioxide, and the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be formed. In addition, in a space that is sealed by the first substrate 4001, the second substrate 4006, and the sealant 4005, a filler 4514 is provided and hermetically sealed. In this manner, it is preferable that packaging (sealing) be performed with a protective film (such as a laminate film or an ultraviolet curable resin film) or a cover material with high air-tightness and little degasification to prevent exposure to the outside air.

As the filler 4514, an ultraviolet curable resin or a thermosetting resin as well as an inert gas such as nitrogen or argon can be used; and PVC (polyvinyl chloride), an acrylic resin, polyimide, an epoxy resin, a silicone resin, PVB (polyvinyl butyral), EVA (ethylene vinyl acetate), or the like can be used. In addition, a drying agent may be contained in the filler 4514.

For the sealant 4005, a glass material such as a glass frit or a resin material such as a resin that is curable at room temperature (e.g., a two-component-mixture-type resin), a light curable resin, or a thermosetting resin can be used. In addition, a drying agent may be contained in the sealant 4005.

In addition, if needed, an optical film such as a polarizing plate, a circularly polarizing plate (including an elliptically polarizing plate), a retardation plate (a $\lambda/4$ plate or a $\lambda/2$ plate), or a color filter may be provided as appropriate on a light-emitting surface of the light-emitting element. Furthermore, the polarizing plate or the circularly polarizing plate may be provided with an anti-reflection film. For example, anti-glare treatment that can reduce glare by diffusing reflected light with projections and depressions on a surface can be performed.

In addition, when the light-emitting element has a microcavity structure, light with high color purity can be extracted. Furthermore, when a microcavity structure and a color filter are used in combination, glare can be reduced and the visibility of a displayed image can be increased.

Whether the first electrode layer and the second electrode layer (also referred to as a pixel electrode layer, a common electrode layer, a counter electrode layer, or the like) for applying a voltage to the display element have light-transmitting properties or light-reflecting properties may be determined in accordance with the direction in which light is extracted, the position where the electrode layer is provided, and the pattern structure of the electrode layer.

For the first electrode layer 4030 and the second electrode layer 4031, a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added can be used.

In addition, the first electrode layer 4030 and the second electrode layer 4031 can be formed using one or more kinds of metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and metal nitrides thereof.

In addition, the first electrode layer 4030 and the second electrode layer 4031 can be formed using a conductive composition including a conductive macromolecule (also referred to as a conductive polymer). As the conductive macromolecule, what is called a π-electron conjugated conductive macromolecule can be used. Examples include polyaniline or a derivative thereof, polypyrrole or a derivative thereof, polythiophene or a derivative thereof, and a copolymer of two or more kinds of aniline, pyrrole, and thiophene or a derivative thereof.

Furthermore, since the transistors are easily broken by static electricity or the like, a protective circuit for protecting the driver circuit is preferably provided. The protective circuit is preferably formed using a nonlinear element.

Figure 10:
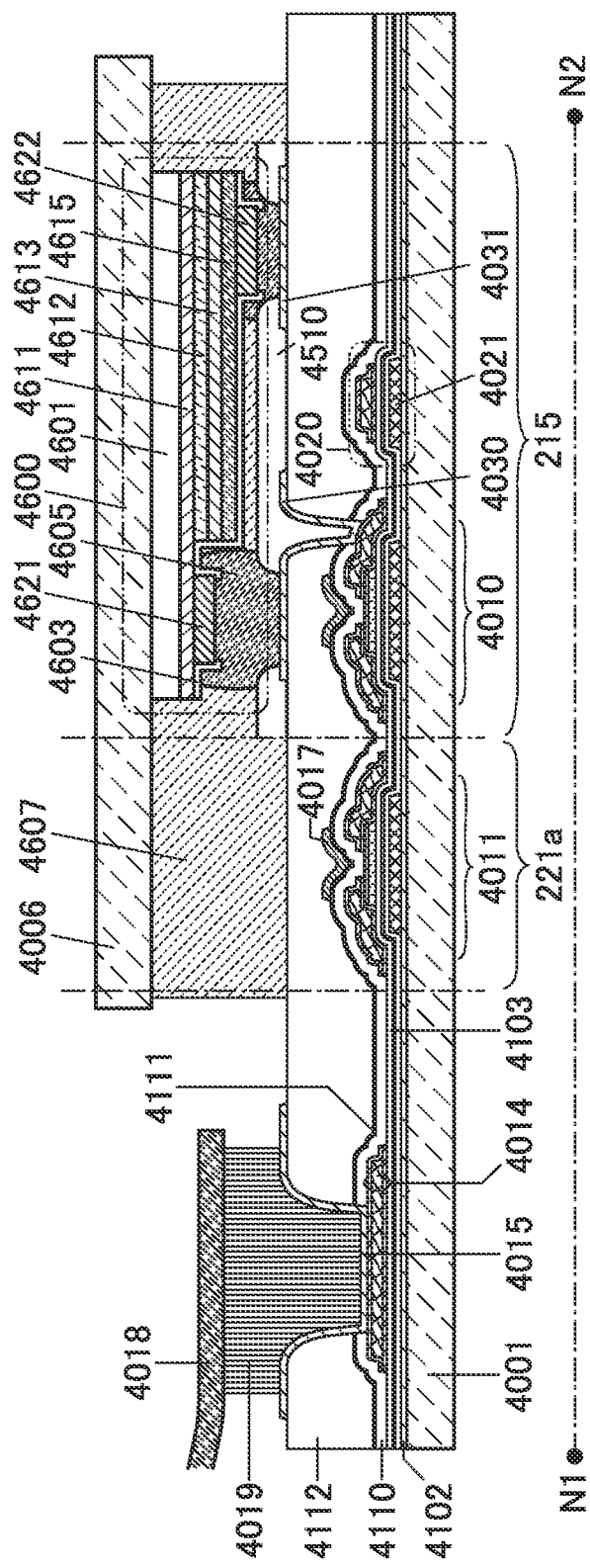
FIG. 10 is a cross-sectional view of a display device example.

FIG. 10 is an example in which a light-emitting diode chip (hereinafter also referred to as an LED chip) is used as a display element.

The LED chip includes a light-emitting diode. There is no particular limitation on the structure of the light-emitting diode; an MIS (Metal Insulator Semiconductor) junction may be used or a homostructure, a heterostructure, a double-heterostructure, or the like having a PN junction or a PIN junction can be used. Alternatively, a superlattice structure, or a single quantum well structure or a multi quantum well (MQW) structure where thin films producing a quantum effect are stacked may be used.

An LED chip 4600 includes a substrate 4601, an n-type semiconductor layer 4611, a light-emitting layer 4612, a p-type semiconductor layer 4613, an electrode 4615, an electrode 4621, an electrode 4622, an insulating layer 4603, and the like.

A material that has larger band gap energy than the light-emitting layer 4612 and allows carriers to be trapped in the light-emitting layer 4612 can be used as a material of the p-type semiconductor layer 4613. In addition, in the LED chip 4600, the electrode 4621 functioning as a cathode is provided over the n-type semiconductor layer 4611, the electrode 4615 functioning as a contact electrode is provided over the p-type semiconductor layer 4613, and the electrode 4622 functioning as an anode is provided over the electrode 4615. Furthermore, a top surface of the n-type semiconductor layer 4611 and a top surface and a side surface of the electrode 4615 are preferably covered with the insulating layer 4603. The insulating layer 4603 functions as a protective film of the LED chip 4600.

The LED chip 4600 can have a light emission area of less than or equal to 1 mm$^2$, preferably less than or equal to 10000 µm$^2$, further preferably less than or equal to 3000 µm$^2$, still further preferably less than or equal to 700 µm$^2$.

A macro LED whose one side dimension is greater than 1 mm may be used as the LED chip 4600; however, a smaller LED is preferably used. In particular, a mini LED whose one side dimension is greater than 100 µm and less than or equal to 1 mm, further preferably, a micro LED whose one side dimension is less than or equal to 100 µm can be used. The use of a micro LED can achieve an extremely high-resolution display device.

The n-type semiconductor layer 4611 may have a stacked-layer structure of an n-type contact layer on the substrate 4601 side and an n-type clad layer on the light-emitting layer 4612 side. In addition, the p-type semiconductor layer 4613 may have a stacked-layer structure of a p-type clad layer on the light-emitting layer 4612 side and a p-type contact layer on the electrode 4615 side.

A multi quantum well (MQW) structure where a barrier layer and a well layer are stacked more than once can be used as the light-emitting layer 4612. For the barrier layer, it is preferable to use a material having larger band gap energy than the well layer. Such a structure allows the energy to be trapped in the well layer, which can improve quantum efficiency and the emission efficiency of the LED chip 4600.

The LED chip 4600 is a face-down type LED chip where light is mainly emitted to the substrate 4601 side. In that case, a material that reflects light can be used for the electrode 4615; for example, a metal such as silver, aluminum, or rhodium can be used. Note that in the case where a face-up type LED chip is used, a light-transmitting material is used for the electrode 4615; for example, an oxide such as ITO ($In_2O_3$—$SnO_2$), AZO ($Al_2O_3$—ZnO), IZO ($In_2O_3$—ZnO), GZO ($GeO_2$—ZnO), or ICO ($In_2O_3$—$CeO_2$) can be used.

For the substrate 4601, oxide single crystal such as sapphire single crystal ($Al_2O_3$), spinel single crystal ($MgAl_2O_4$), ZnO single crystal, $LiAlO_2$ single crystal, $LiGaO_2$ single crystal, or MgO single crystal; Si single crystal; SiC single crystal; GaAs single crystal; AlN single crystal; GaN single crystal; boride single crystal such as $ZrB_2$; or the like can be used. In the LED chip 4600 of a face-down type, a light-transmitting material is preferably used for the substrate 4601; for example, sapphire single crystal or the like can be used.

In addition, a buffer layer (not shown) may be provided between the substrate 4601 and the n-type semiconductor layer 4611. The buffer layer has a function of alleviating the difference in lattice constant between the substrate 4601 and the n-type semiconductor layer 4611.

The electrode 4621 and the electrode 4622 included in the LED chip 4600 are bonded to the first electrode layer 4030 and the second electrode layer 4031, respectively, through bumps 4605.

In addition, a light-blocking resin layer 4607 is preferably provided to cover side surfaces of the LED chip 4600. Accordingly, light emitted from the LED chip 4600 in a lateral direction can be blocked, and the decrease in contrast due to waveguide light can be prevented.

Furthermore, FIG. 10 illustrates an example where the substrate 4006 is further included over the substrate 4601. When the resin layer 4607 is provided around the LED chip 4600 and a top surface of the LED chip 4600 is covered with the substrate 4006 in this manner, bonding of the LED chip 4600 can be further strengthened, and bonding defects of the LED chip 4600 can be favorably prevented.

Figure 11:
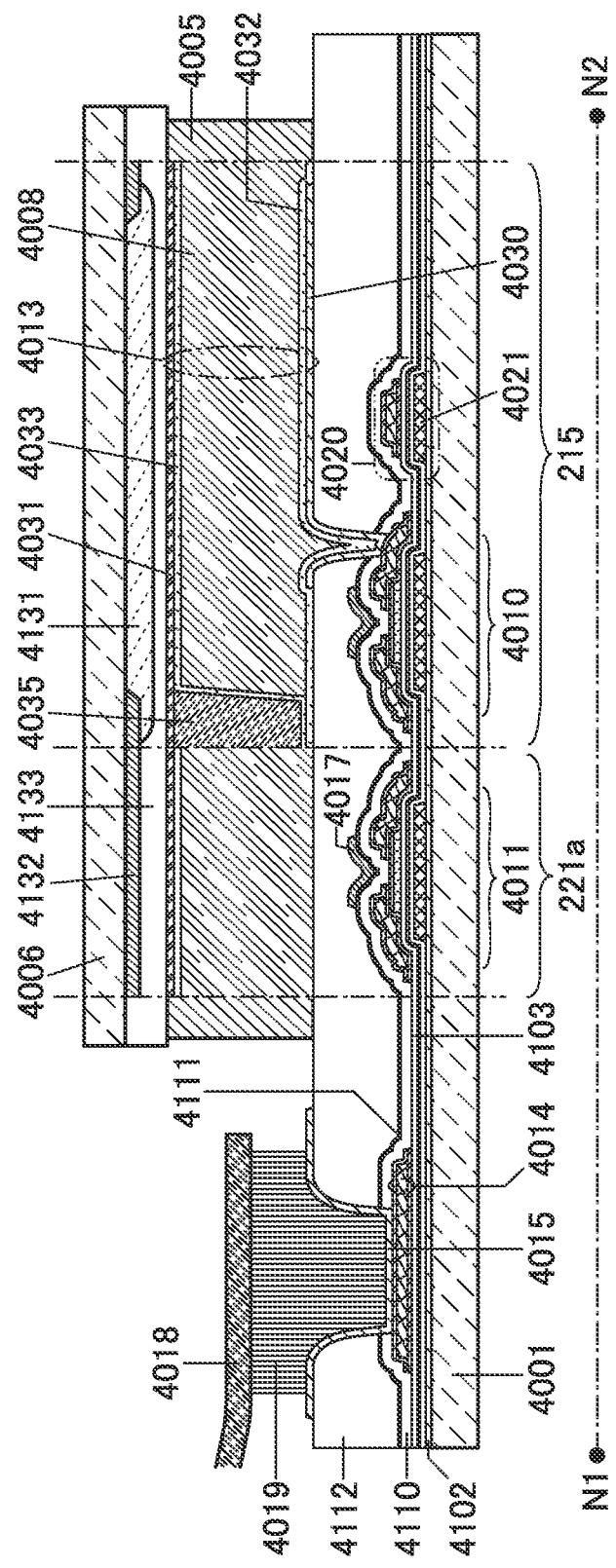
FIG. 11 is a cross-sectional view of a display device example.

FIG. 11 is an example of a liquid crystal display device using a liquid crystal element as a display element.

In FIG. 11, a liquid crystal element 4013 that is a display element includes the first electrode layer 4030, the second electrode layer 4031, and a liquid crystal layer 4008. Note that an insulating layer 4032 and an insulating layer 4033 functioning as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 therebetween.

In addition, a spacer 4035 is a columnar spacer obtained by selective etching of an insulating layer and is provided to control the distance (cell gap) between the first electrode layer 4030 and the second electrode layer 4031. Note that a spherical spacer may be used.

In addition, a black matrix (light-blocking layer), a coloring layer (color filter), an optical member (optical substrate) such as a polarizing member, a retardation member, or an anti-reflection member, and the like may be provided as appropriate if needed. For example, circular polarization using a polarizing substrate and a retardation substrate may be employed. Furthermore, a backlight, a side light, or the like may be used as a light source. Moreover, a micro LED or the like may be used as the backlight or the side light.

In the display device illustrated in FIG. 11, a light-blocking layer 4132, a coloring layer 4131, and an insulating layer 4133 are provided between the substrate 4006 and the second electrode layer 4031.

Examples of a material that can be used for the light-blocking layer 4132 include carbon black, titanium black, a metal, a metal oxide, and a composite oxide containing a solid solution of a plurality of metal oxides. The light-blocking layer 4132 may be a film containing a resin material or may be a thin film of an inorganic material such as a metal. A stacked-layer film of films containing the material of the coloring layer 4131 can also be used for the light-blocking layer 4132. For example, it is possible to employ a stacked-layer structure of a film containing a material used for a coloring layer that transmits light of a certain color and a film containing a material used for a coloring layer that transmits light of another color. Material sharing between the coloring layer and the light-blocking layer is preferable because process simplification as well as equipment sharing can be achieved.

Examples of a material that can be used for the coloring layer 4131 include a metal material, a resin material, and a resin material containing a pigment or dye. The light-blocking layer and the coloring layer may be formed by a method similar to the method for forming each layer. For example, the light-blocking layer and the coloring layer may be formed by an inkjet method or the like.

At least part of this embodiment can be implemented in combination with the other embodiments described in this specification as appropriate.

Embodiment 3

In this embodiment, the structure of a transistor that can be used in a semiconductor device or a display device of one embodiment of the present invention will be described.

The display device or the display device of one embodiment of the present invention can be manufactured using a transistor with various modes, such as a bottom-gate transistor or a top-gate transistor. Therefore, a material used for a semiconductor layer or a transistor structure can be easily changed depending on the existing manufacturing line.

[Bottom-Gate Transistor]

FIG. 12A1 is a cross-sectional view of a channel protective transistor 810 that is a kind of bottom-gate transistor. The transistor 810 is formed over a substrate 771. In addition, the transistor 810 includes an electrode 746 over the substrate 771 with an insulating layer 772 therebetween. The transistor 810 further includes a semiconductor layer 742 over the electrode 746 with an insulating layer 726 therebetween. The electrode 746 can function as a gate electrode. The insulating layer 726 can function as a gate insulating layer.

The transistor 810 further includes an insulating layer 741 over a channel formation region in the semiconductor layer 742. The transistor 810 further includes an electrode 744a and an electrode 744b that are partly in contact with the semiconductor layer 742 and are over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be achieved.

Furthermore, the transistor 810 includes an insulating layer 728 over the electrode 744a, the electrode 744b, and the insulating layer 741 and includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b that are in contact with the semiconductor layer 742. The carrier concentration in regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as a source region or a drain region of the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 12A2 is different from the transistor 810 in that an electrode 723 that can function as a back gate electrode is provided over the insulating layer 729. The electrode 723 can be formed using a material and a method similar to those of the electrode 746.

In general, a back gate electrode is formed using a conductive layer and positioned so that a channel formation region of a semiconductor layer is sandwiched between a gate electrode and the back gate electrode. Thus, the back gate electrode can function in a manner similar to that of the gate electrode. The potential of the back gate electrode may be set equal to the potential of the gate electrode, or may be a ground potential (GND potential) or a given potential. Moreover, by changing the potential of the back gate electrode not in synchronization with but independently of that of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode," the other is referred to as a "back gate electrode." For example, in the case where the electrode 723 in the transistor 811 is referred to as a "gate electrode," the electrode 746 is referred to as a "back gate electrode." In addition, in the case where the electrode 723 is used as a "gate electrode," the transistor 811 can be considered as a kind of top-gate transistor. Furthermore, in some cases, one of the electrode 746 and the electrode 723 is referred to as a "first gate electrode," and the other is referred to as a "second gate electrode."

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having a high on-state current for its occupation area. That is, the occupation area of the transistor 811 can be small for a required on-state current. According to one embodiment of the present invention, the occupation area of a transistor can be reduced. Therefore, according to one embodiment of the present invention, a semiconductor device having a high degree of integration can be achieved.

In addition, the gate electrode and the back gate electrode are formed using conductive layers and thus each have a function of preventing an electric field generated outside the transistor from influencing a semiconductor layer in which a channel is formed (in particular, an electric field blocking function against static electricity or the like). Note that when the back gate electrode is formed larger than the semiconductor layer such that the semiconductor layer is covered with the back gate electrode, the electric field blocking function can be enhanced.

Furthermore, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

According to one embodiment of the present invention, a transistor with high reliability can be achieved. Moreover, a semiconductor device with high reliability can be achieved.

FIG. 12B1 is a cross-sectional view of a channel-protective transistor 820 that is a kind of bottom-gate transistor. The transistor 820 has substantially the same structure as the transistor 810 but is different from the transistor 810 in that the insulating layer 741 covers end portions of the semiconductor layer 742. In addition, the semiconductor layer 742 is electrically connected to the electrode 744a in an opening portion formed by selectively removing part of the insulating layer 741 that overlaps with the semiconductor layer 742. Furthermore, the semiconductor layer 742 is electrically connected to the electrode 744b in another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 12B2 is different from the transistor 820 in that the electrode 723 that can function as a back gate electrode is provided over the insulating layer 729.

By providing the insulating layer 741, the semiconductor layer 742 can be prevented from being exposed at the time of forming the electrode 744a and the electrode 744b. Thus, the semiconductor layer 742 can be prevented from being thinned down at the time of forming the electrode 744a and the electrode 744b.

In addition, the distance between the electrode 744a and the electrode 746 and the distance between the electrode 744b and the electrode 746 in the transistor 820 and the transistor 821 are larger than those in the transistor 810 and the transistor 811. Thus, parasitic capacitance generated between the electrode 744a and the electrode 746 can be reduced. Moreover, parasitic capacitance generated between the electrode 744b and the electrode 746 can be reduced. According to one embodiment of the present invention, a transistor with favorable electrical characteristics can be achieved.

A transistor 825 illustrated in FIG. 12C1 is a channel-etched transistor that is a kind of bottom-gate transistor. In the transistor 825, the electrode 744a and the electrode 744b are formed without using the insulating layer 741. Thus, part of the semiconductor layer 742 that is exposed at the time of forming the electrode 744a and the electrode 744b is etched in some cases. Meanwhile, since the insulating layer 741 is not provided, the productivity of the transistor can be increased.

A transistor 826 illustrated in FIG. 12C2 is different from the transistor 820 in that the electrode 723 that can function as a back gate electrode is provided over the insulating layer 729.

[Top-Gate Transistor]

A transistor 842 illustrated as an example in FIG. 13A1 is a kind of top-gate transistor. The transistor 842 is different from the transistor 810, the transistor 811, the transistor 820, the transistor 821, the transistor 825, and the transistor 826 in that the electrode 744a and the electrode 744b are formed after the insulating layer 729 is formed. The electrode 744a and the electrode 744b are electrically connected to the semiconductor layer 742 in opening portions formed in the insulating layer 728 and the insulating layer 729.

In addition, part of the insulating layer 726 that does not overlap with the electrode 746 is removed, and an impurity 755 is introduced into the semiconductor layer 742 using the electrode 746 and the remaining part of the insulating layer 726 as a mask, so that an impurity region can be formed in the semiconductor layer 742 in a self-aligned manner (see FIG. 13A3). The transistor 842 includes a region where the insulating layer 726 extends beyond end portions of the electrode 746. The semiconductor layer 742 in a region into which the impurity 755 is introduced through the insulating layer 726 has a lower impurity concentration than a region into which the impurity 755 is introduced without through the insulating layer 726. Thus, an LDD (Lightly Doped Drain) region is formed in a region of the semiconductor layer 742 that does not overlap with the electrode 746.

A transistor 843 illustrated in FIG. 13A2 is different from the transistor 842 in that the electrode 723 is included. The transistor 843 includes the electrode 723 formed over the substrate 771. The electrode 723 overlaps with the semiconductor layer 742 with the insulating layer 772 therebetween. The electrode 723 can function as a back gate electrode.

In addition, as in a transistor 844 illustrated in FIG. 13B1 and a transistor 845 illustrated in FIG. 13B2, the insulating layer 726 in a region that does not overlap with the electrode 746 may be completely removed. Furthermore, as in a transistor 846 illustrated in FIG. 13C1 and a transistor 847 illustrated in FIG. 13C2, the insulating layer 726 may be left.

Also in the transistor 842 to the transistor 847, the impurity 755 is introduced into the semiconductor layer 742 using the electrode 746 as a mask after the formation of the electrode 746, so that an impurity region can be formed in the semiconductor layer 742 in a self-aligned manner. According to one embodiment of the present invention, a transistor with favorable electrical characteristics can be achieved. Furthermore, according to one embodiment of the present invention, a semiconductor device having a high degree of integration can be achieved.

At least part of this embodiment can be implemented in combination with the other embodiments described in this specification as appropriate.

Embodiment 4

In this embodiment, the composition of a metal oxide that can be used in the OS transistor described in the above embodiment will be described.

<Composition of Metal Oxide>

The terms "CAAC (c-axis aligned crystal)" and "CAC (Cloud-Aligned Composite)" might appear in this specification and the like. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above conducting function, and the insulating regions have the above insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow through the component having a narrow gap. Furthermore, the component having a narrow gap complements the component having a wide gap, and carriers also flow through the component having a wide gap in conjunction with the component having a narrow gap. Therefore, in the case where the CAC-OS or the CAC-metal oxide is used for the channel formation region of the transistor, high current drive capability in an on state of the transistor, that is, a high on-state current and high field-effect mobility can be obtained.

In other words, the CAC-OS or the CAC-metal oxide can also be referred to as a matrix composite or a metal matrix composite.

<Structure of Metal Oxide>

Oxide semiconductors are classified into a single crystal oxide semiconductor and a non-single crystal oxide semiconductor. Examples of a non-single crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of lattice arrangement changes between a region with regular lattice arrangement and another region with regular lattice arrangement in a region where the plurality of nanocrystals are connected.

The nanocrystal is basically a hexagon but is not always a regular hexagon and is a non-regular hexagon in some cases. Furthermore, pentagonal lattice arrangement, heptagonal lattice arrangement, and the like are included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to the low density of oxygen atom arrangement in the a-b plane direction, a change in interatomic bond distance by replacement of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, it can be said that a reduction in electron mobility due to the crystal grain boundary is less likely to occur because a clear crystal grain boundary cannot be observed. Furthermore, the mixing of impurities, formation of defects, or the like might decrease the crystallinity of the oxide semiconductor; thus, it can also be said that the CAAC-OS is an oxide semiconductor having small amounts of impurities and defects (oxygen vacancies or the like). Thus, an oxide semiconductor including a CAAC-OS is physically stable. Therefore, the oxide semiconductor including a CAAC-OS is resistant to heat and has high reliability. Moreover, the CAAC-OS is also stable with respect to high temperature in the manufacturing process (what is called thermal budget). Accordingly, the use of the CAAC-OS for the OS transistor can extend a degree of freedom of the manufacturing process.

In the nc-OS, a microscopic region (for example, a region with a size greater than or equal to 1 nm and less than or equal to 10 nm, in particular, a region with a size greater than or equal to 1 nm and less than or equal to 3 nm) has periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is an oxide semiconductor that has a structure between those of the nc-OS and the amorphous oxide semiconductor. The a-like OS includes a void or a low-density region. That is, the a-like OS has lower crystallinity than the nc-OS and the CAAC-OS.

An oxide semiconductor has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

Note that when the above oxide semiconductor is used for a transistor, a transistor with high field-effect mobility can be achieved. In addition, a transistor with high reliability can be achieved.

In addition, an oxide semiconductor with a low carrier density is preferably used for a transistor. In the case where the carrier density of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. For example, the carrier density of the oxide semiconductor is set lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$.

In addition, a highly purified intrinsic or substantially highly purified intrinsic oxide semiconductor film has a low density of defect states and thus has a low density of trap states in some cases.

Furthermore, electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Thus, in order to stabilize electrical characteristics of the transistor, reducing the impurity concentration in the oxide semiconductor is effective. Furthermore, in order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

[Impurity]

Here, the influence of each impurity in the oxide semiconductor is described.

When silicon or carbon, which is one of the Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

Furthermore, when the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Accordingly, it is preferable to reduce the concentration of an alkali metal or an alkaline earth metal in the oxide semiconductor. Specifically, the concentration of an alkali metal or an alkaline earth metal in the oxide semiconductor that is obtained by SIMS is set lower than or equal to $1 \times 10^{18}$ atoms/$cm^3$, preferably lower than or equal to $2 \times 10^{16}$ atoms/$cm^3$.

Furthermore, when the oxide semiconductor contains nitrogen, the oxide semiconductor easily becomes n-type by generation of electrons serving as carriers and an increase of carrier density. As a result, a transistor using an oxide semiconductor containing nitrogen as a semiconductor is likely to have normally-on characteristics. For this reason, nitrogen in the oxide semiconductor is preferably reduced as much as possible. The nitrogen concentration in the oxide semiconductor that is obtained by SIMS is set, for example, lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurities is used for the channel formation region of the transistor, stable electrical characteristics can be given.

At least part of this embodiment can be implemented in combination with the other embodiments described in this specification as appropriate.

Embodiment 5

In this embodiment, examples of a product in which the semiconductor device or the display device described in the above embodiment is applied to an electronic device will be described.

<Laptop Personal Computer>

Figure 14A:
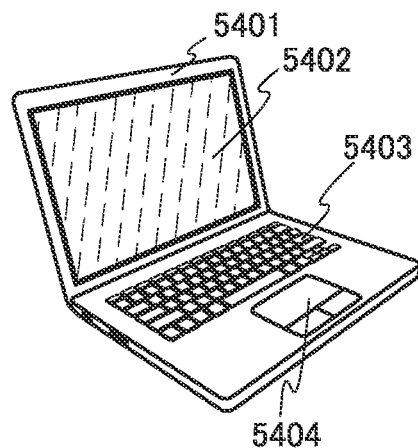
FIG. 14A to FIG. 14F are perspective views each illustrating an electronic device example.

The semiconductor device or the display device of one embodiment of the present invention can be applied to a display provided in an information terminal device. FIG. 14A is a laptop personal computer that is a kind of information terminal device. The laptop personal computer includes a housing 5401, a display portion 5402, a keyboard 5403, a pointing device 5404, and the like.

<Smartwatch>

Figure 14B:
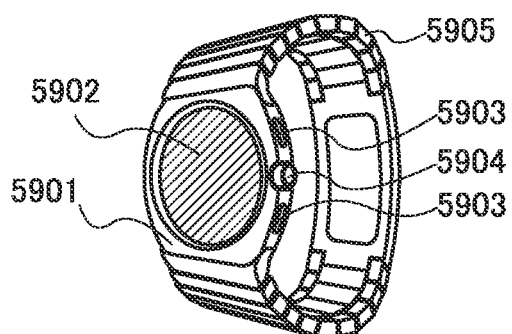

The semiconductor device or the display device of one embodiment of the present invention can be applied to a wearable terminal. FIG. 14B is a smartwatch that is a kind of wearable terminal. The smartwatch includes a housing 5901, a display portion 5902, operation buttons 5903, an operator 5904, a band 5905, and the like. A display device with a function of a position input device may be used for the display portion 5902. The function of the position input device can be added by provision of a touch panel in a display device. Alternatively, the function of the position input device can be added by provision of a photoelectric conversion element called a photosensor in a pixel portion of a display device. In addition, as the operation buttons 5903, any of a power switch for activating the smartwatch, a button for operating an application of the smartwatch, a volume control button, a switch for turning on or off the display portion 5902, and the like can be provided. Furthermore, although the number of the operation buttons 5903 is two in the smartwatch illustrated in FIG. 14B, the number of the operation buttons of the smartwatch is not limited thereto. The operator 5904 functions as a crown used for setting the time on the smartwatch. In addition, the operator 5904 may be used as an input interface for operating an application of the smartwatch as well as the crown for time adjustment. Note that although the smartwatch illustrated in FIG. 14B has a structure with the operator 5904, without being limited thereto, a structure without the operator 5904 may be used.

<Video Camera>

Figure 14C:
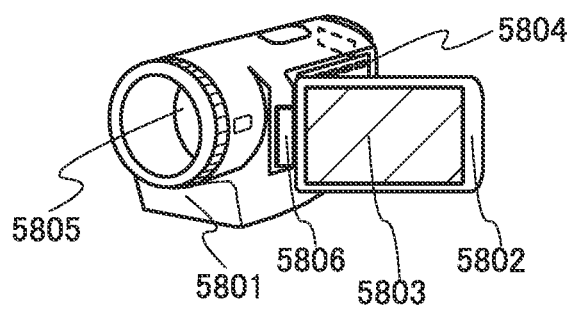

The semiconductor device or the display device of one embodiment of the present invention can be applied to a video camera. The video camera illustrated in FIG. 14C includes a first housing 5801, a second housing 5802, a display portion 5803, operation keys 5804, a lens 5805, a joint portion 5806, and the like. The operation keys 5804 and the lens 5805 are provided in the first housing 5801, and the display portion 5803 is provided in the second housing 5802. The first housing 5801 and the second housing 5802 are connected to each other with the joint portion 5806, and an angle between the first housing 5801 and the second housing 5802 can be changed with the joint portion 5806. A structure in which images on the display portion 5803 are changed in accordance with the angle at the joint portion 5806 between the first housing 5801 and the second housing 5802 may be employed.

<Cellular Phone>

Figure 14D:
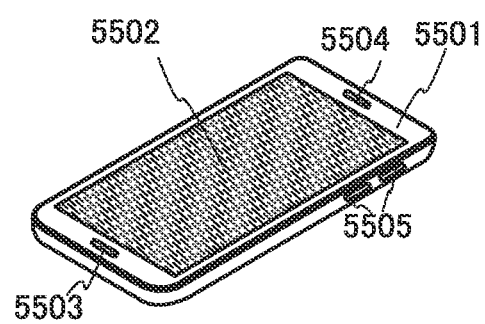

The semiconductor device or the display device of one embodiment of the present invention can be applied to a cellular phone. FIG. 14D is a cellular phone having a function of an information terminal, which includes a housing 5501, a display portion 5502, a microphone 5503, a speaker 5504, and operation buttons 5505. A display device with a function of a position input device may be used for the display portion 5502. The function of the position input device can be added by provision of a touch panel in a display device. Alternatively, the function of the position input device can be added by provision of a photoelectric conversion element called a photosensor in a pixel portion of a display device. As the operation buttons 5505, any of a power switch for activating the cellular phone, a button for operating an application of the cellular phone, a volume control button, a switch for turning on or off the display portion 5502, and the like can be provided.

Although the cellular phone illustrated in FIG. 14D includes two operation buttons 5505, the number of the operation buttons included in the cellular phone is not limited thereto. Although not illustrated, the cellular phone illustrated in FIG. 14D may include a light-emitting device for use as a flash light or lighting.

<Television Device>

Figure 14E:
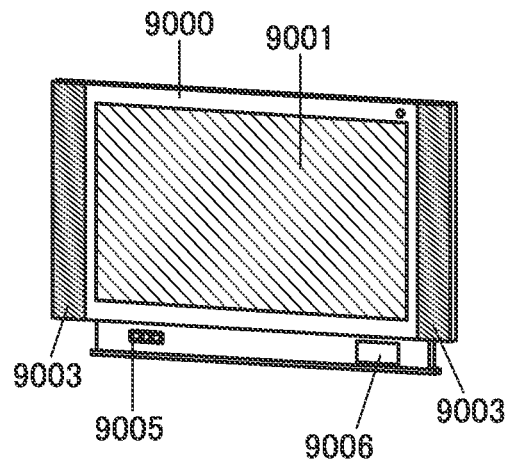

The semiconductor device or the display device of one embodiment of the present invention can be applied to a television device. A television device illustrated in FIG. 14E includes a housing 9000, a display portion 9001, speakers 9003, operation keys 9005 (including a power switch or an operation switch), a connection terminal 9006, and the like. The display portion 9001 having a large screen size of, for example, larger than or equal to 50 inches or larger than or equal to 100 inches can be incorporated in the television device.

<Moving Vehicle>

The semiconductor device or the display device of one embodiment of the present invention can be used around a driver's seat in a motor vehicle, which is a moving vehicle.

Figure 14F:
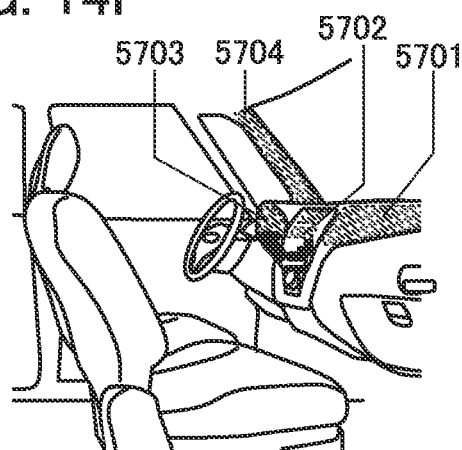

FIG. 14F is a figure that illustrates a windshield and its vicinity inside a motor vehicle, for example. In FIG. 14F, a display panel 5701, a display panel 5702, and a display panel 5703 that are attached to a dashboard, and a display panel 5704 that is attached to a pillar are illustrated.

The display panel 5701 to the display panel 5703 can provide a variety of information by displaying navigation information, a speedometer, a tachometer, mileage, a fuel gauge, a gear state, air-conditioner settings, and the like. In addition, the content, layout, and the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging unit provided for a car body. That is, displaying an image taken by an imaging unit provided outside the motor vehicle leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

<Electronic Device for Electronic Public Notice>

Figure 15A:
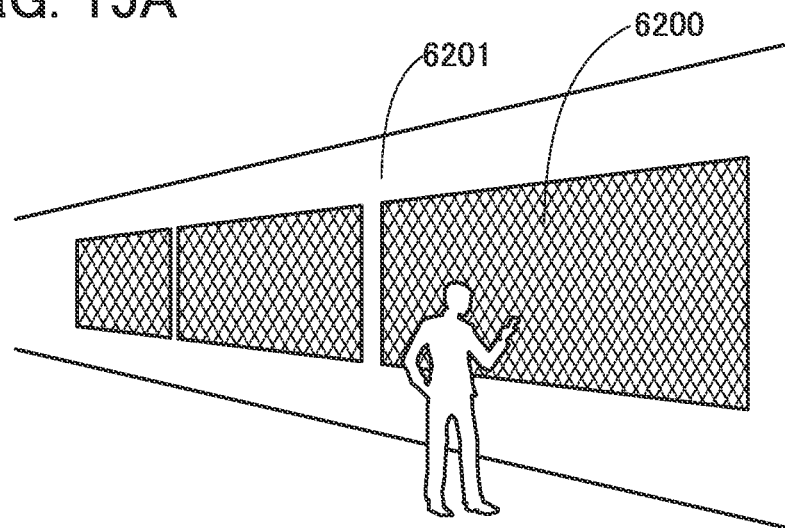
FIG. 15A and FIG. 15B are perspective views each illustrating an electronic device example.

The semiconductor device or the display device of one embodiment of the present invention can be applied to a display used for an electronic public notice. FIG. 15A shows an example of digital signage that can be attached to a wall. FIG. 15A illustrates how digital signage 6200 is attached to a wall 6201.

<Foldable Tablet Information Terminal>

Figure 15B:
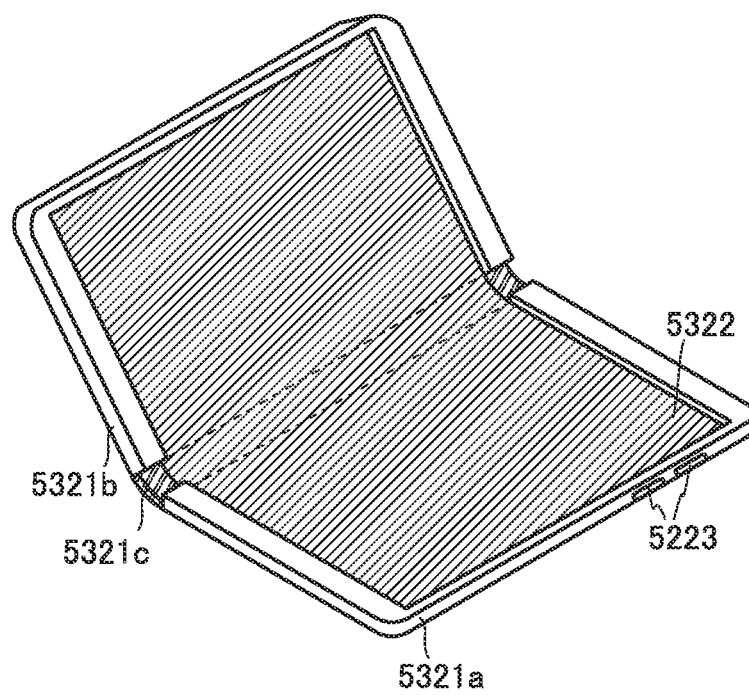

The semiconductor device or the display device of one embodiment of the present invention can be applied to a tablet information terminal. FIG. 15B illustrates a tablet information terminal with a foldable structure. The information terminal shown in FIG. 15B includes a housing 5321*a*, a housing 5321*b*, a display portion 5322, and an operation button 5323. In particular, the display portion 5322 includes a flexible base, and the base enables a foldable structure.

The housing 5321*a* and the housing 5321*b* are bonded to each other with a hinge portion 5321*c* that allows the display portion 5322 to be folded in half. The display portion 5322 is provided in the housing 5321*a*, the housing 5321*b*, and the hinge portion 5321*c*.

Although not illustrated, the electronic devices illustrated in FIG. 14A to FIG. 14C, FIG. 14E, FIG. 15A, and FIG. 15B can each have a structure that includes a microphone and a speaker. With this structure, the electronic devices can each have an audio input function, for example.

In addition, although not illustrated, the electronic devices illustrated in FIG. 14A, FIG. 14B, FIG. 14D, FIG. 15A, and FIG. 15B may each have a structure that includes a camera.

In addition, although not illustrated, the electronic devices illustrated in FIG. 14A to FIG. 14F, FIG. 15A, and FIG. 15B may each have a structure provided with a sensor (a sensor having a function of measuring force, displacement, position, speed, acceleration, angular velocity, rotational frequency, distance, light, liquid, magnetism, temperature, a chemical substance, sound, time, hardness, an electric field, a current, a voltage, power, radioactive rays, flow rate, humidity, a gradient, oscillation, odor, or infrared rays) in the housing. In particular, by providing a detection device including a sensor for detecting tilt, such as a gyroscope sensor or an acceleration sensor, for the cellular phone illustrated in FIG. 14D, the orientation of the cellular phone (the orientation of the cellular phone with respect to a vertical direction) is determined, so that display on the display portion 5502 can be automatically changed in accordance with the orientation of the cellular phone.

In addition, although not illustrated, the electronic devices illustrated in FIG. 14A to FIG. 14F, FIG. 15A, and FIG. 15B may each have a structure that includes a device for obtaining biological information such as a fingerprint, a vein, an iris, or a voiceprint. With this structure, an electronic device having a biometric authentication function can be achieved.

A flexible base may be used for the display portion of each of the electronic devices illustrated in FIG. 14A to FIG. 14E and FIG. 15A. Specifically, the display portion may have a structure in which a transistor, a capacitor, a display element, and the like are provided over a flexible base. Employing this structure can achieve not only the electronic device having the housing with a flat surface as shown in FIG. 14A to FIG. 14E and FIG. 15A but also an electronic device having a housing with a curved surface like the dashboard and the pillar shown in FIG. 14F.

As a flexible base that can be used for the display portions in FIG. 14A to FIG. 14F, FIG. 15A, and FIG. 15B, the following materials that transmit visible light can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, a urethane resin, and the like. Alternatively, a mixture or a stack of these materials may be used.

At least part of this embodiment can be implemented in combination with the other embodiments described in this specification as appropriate.

REFERENCE NUMERALS

DD: display device, PA: display portion, GD: gate driver circuit, SD: source driver circuit, PIX: pixel, SR: shift register, LAT: latch circuit, LVS: level shift circuit, DAC: digital-analog converter circuit, AMP: amplifier circuit, GL: wiring, DL: wiring, DB: data bus wiring, Tr1 to Tr7: transistor, C1, C2, and C3: capacitor, LD: light-emitting element, GL1 to GL4: wiring, DL: wiring, WDL: wiring, VL: wiring, AL: wiring, CAT: wiring, ND1: node, and ND2: node.

What is claimed is:
1. A semiconductor device comprising:
a pixel comprising:
    a display element; and
    a transistor electrically connected to the display element,
wherein the display element comprises:
    a first semiconductor layer;
    a light-emitting layer over the first semiconductor layer;
    a second semiconductor layer over the light-emitting layer;
    a first electrode over and in contact with the first semiconductor layer; and
    a second electrode over and in contact with the second semiconductor layer,
wherein an insulating layer is in contact with a top surface of the first electrode and a top surface and a side surface of the second electrode, and
wherein a resin layer is in contact with the insulating layer.

2. The semiconductor device according to claim 1,
wherein the first semiconductor layer is an n-type semiconductor layer, and
wherein the second semiconductor layer is a p-type semiconductor layer.

3. The semiconductor device according to claim 1,
wherein the pixel is configured to retain a first voltage corresponding to a first pulse signal and is configured to drive the display element with a third voltage obtained by addition of a second voltage corresponding to a second pulse signal to the first voltage,
wherein the third voltage is higher than the first voltage, and
wherein the third voltage is higher than the second voltage.

4. A semiconductor device comprising:
a pixel comprising:
    a display element; and
    a transistor,
wherein an electrode layer is electrically connected to one of a source and a drain of the transistor,
wherein the electrode layer is electrically connected to an electrode of the display element through a bump,
wherein the bump is positioned in an opening of a partition, and
wherein the bump has a width larger than a width of the opening of the partition.

5. The semiconductor device according to claim 4,
wherein the display element comprises:
    a first semiconductor layer;
    a light-emitting layer over the first semiconductor layer; and
    a second semiconductor layer over the light-emitting layer.

6. The semiconductor device according to claim 5,
wherein the first semiconductor layer is an n-type semiconductor layer, and
wherein the second semiconductor layer is a p-type semiconductor layer.

7. The semiconductor device according to claim 1,
wherein the pixel is configured to retain a first voltage corresponding to a first pulse signal and is configured to drive the display element with a third voltage obtained by addition of a second voltage corresponding to a second pulse signal to the first voltage, wherein the third voltage is higher than the first voltage, and wherein the third voltage is higher than the second voltage.

8. A semiconductor device comprising:
a pixel comprising:
   a display element;
   a transistor electrically connected to the display element; and
   an insulating layer between the display element and the transistor,
wherein the insulating layer is in contact with a top surface of a first electrode of the display element and a top surface and a side surface of a second electrode of the display element, and
wherein a distance between a substrate and the first electrode is different from a distance between the substrate and the second electrode.

* * * * *